United States Patent
Nosaka et al.

(10) Patent No.: US 6,188,261 B1
(45) Date of Patent: Feb. 13, 2001

(54) PROGRAMMABLE DELAY GENERATOR AND APPLICATION CIRCUITS HAVING SAID DELAY GENERATOR

(75) Inventors: Hideyuki Nosaka; Akira Minakawa; Yo Yamaguchi; Akihiro Yamagishi, all of Tokyo (JP)

(73) Assignee: Nippon Telegraph and Telephone Corporation, Tokyo (JP)

(*) Notice: Under 35 U.S.C. 154(b), the term of this patent shall be extended for 0 days.

(21) Appl. No.: 09/233,427

(22) Filed: Jan. 20, 1999

(30) Foreign Application Priority Data

Jan. 26, 1998 (JP) .................................................. 10-012728

(51) Int. Cl.$^7$ .............................. H03K 3/01; H03B 21/00
(52) U.S. Cl. ......................... 327/261; 327/105; 327/107; 327/116; 327/172; 327/156; 327/131; 327/122; 708/276
(58) Field of Search ..................................... 327/156, 131, 327/105, 113, 261, 132, 122, 116, 119, 270, 107, 172; 708/276

(56) References Cited

U.S. PATENT DOCUMENTS 5,574,392 * 11/1996 Jordan .................................. 327/131

OTHER PUBLICATIONS

*Linear Databook 1994/1995*, pp. (12–36) –(12–64) by Analog Devices Co.
"A Short Survey of Frequency Synthesizer Techniques", V. Reinhardt et al, Proc. 40th Annual Frequency Control Symp., pp. 355 –365, May 1986.
"A Phase Interpolation Direct Digital Synthesizer with a Digitally Controlled Delay Generator", 1997 Symp. VLSI Circuits Dig., pp. 75 –76, Jun. 1997.
"Digital–Computer Synthesizers of Two–Level Signals with Phase–Error Compensation", V.N. Kochemasov et al, *Telecommunications and Radio Engineering*, vol. 36/37, pp. 55–59, Oct. 1982.
"A Phase Noise Reduction Technique for MMIC Frequency Synthesizer that Uses a New Pulse Generator LSI", T. Nakagawa et al, *IEEE Trans. Microwave Theory Tech.*, vol. 42, No. 12, pp. 2579 –2582, Dec. 1994.

* cited by examiner

*Primary Examiner*—Dinh T. Le
(74) *Attorney, Agent, or Firm*—Arent Fox Kintner Plotkin & Kahn, PLLC

(57) ABSTRACT

A programmable delay generator comprises a first ramp wave generator and a second ramp wave generator, each having the same structure as each other, each of them operating with external common clock pulses, and each of them providing potential gradient and final potential incorporated with an external set data; a comparator for comparing an output ($V_s$) of the first ramp wave generator and an output ($V_k$) of the second ramp wave generator so that an output pulse is provided when the outputs of two ramp wave generators coincide with each other; said first ramp wave generator providing a first ramp voltage ($V_s$) upon receipt of a first set data (S) at a predetermined time ($t_0$); said second ramp wave generator providing a threshold voltage ($V_k$) upon receipt of a second set data (K) at a time which preceds at least one clock time (T) than said predetermined time ($t_0$); said comparator providing an output pulse delayed by delay time ($t_d$) which is proportional to ratio (K/S) of said second set data (K) and said first set data (S) from said predetermined time. An application circuit using said programmable delay generator, including a frequency synthesizer, a frequency multiplier, a duty ratio converter, and a PLL frequency synthesizer is also provided.

22 Claims, 29 Drawing Sheets

Fig. 7
(a) CLOCK 301 
(b) OUTPUT $\theta$ OF ACCUMULATOR 40A 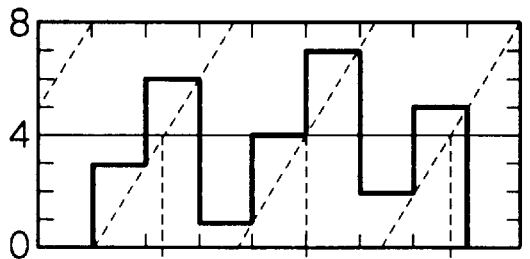
(c) $\theta_{MSB}$ (S-ENABLE SIGNAL 101)
(d) RAMP WAVE VOLTAGE $V_S$ 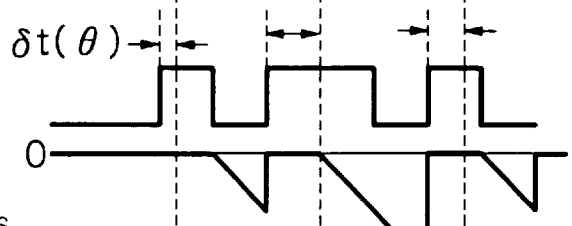
(e) K-ENABLE SIGNAL 201
(f) THRESHOLD VOLTAGE $V_K$ 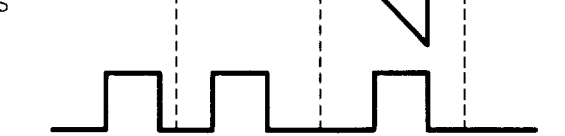
(d) RAMP WAVE VOLTAGE $V_S$
(f) THRESHOLD VOLTAGE $V_K$ 
(g) OUTPUT SIGNAL 302 
(h) K-LEAK SIGNAL 203 
(i) S-LEAK SIGNAL 103 

(a) TRIGGER SIGNAL 402
(b) LATCH SIGNAL 403
(c) SET DATA 404
(d) LEAK SIGNAL 401
(e) RAMP WAVE VOLTAGE $V_S$
(f) THRESHOLD VOLTAGE $V_K$
(g) OUTPUT SIGNAL 405

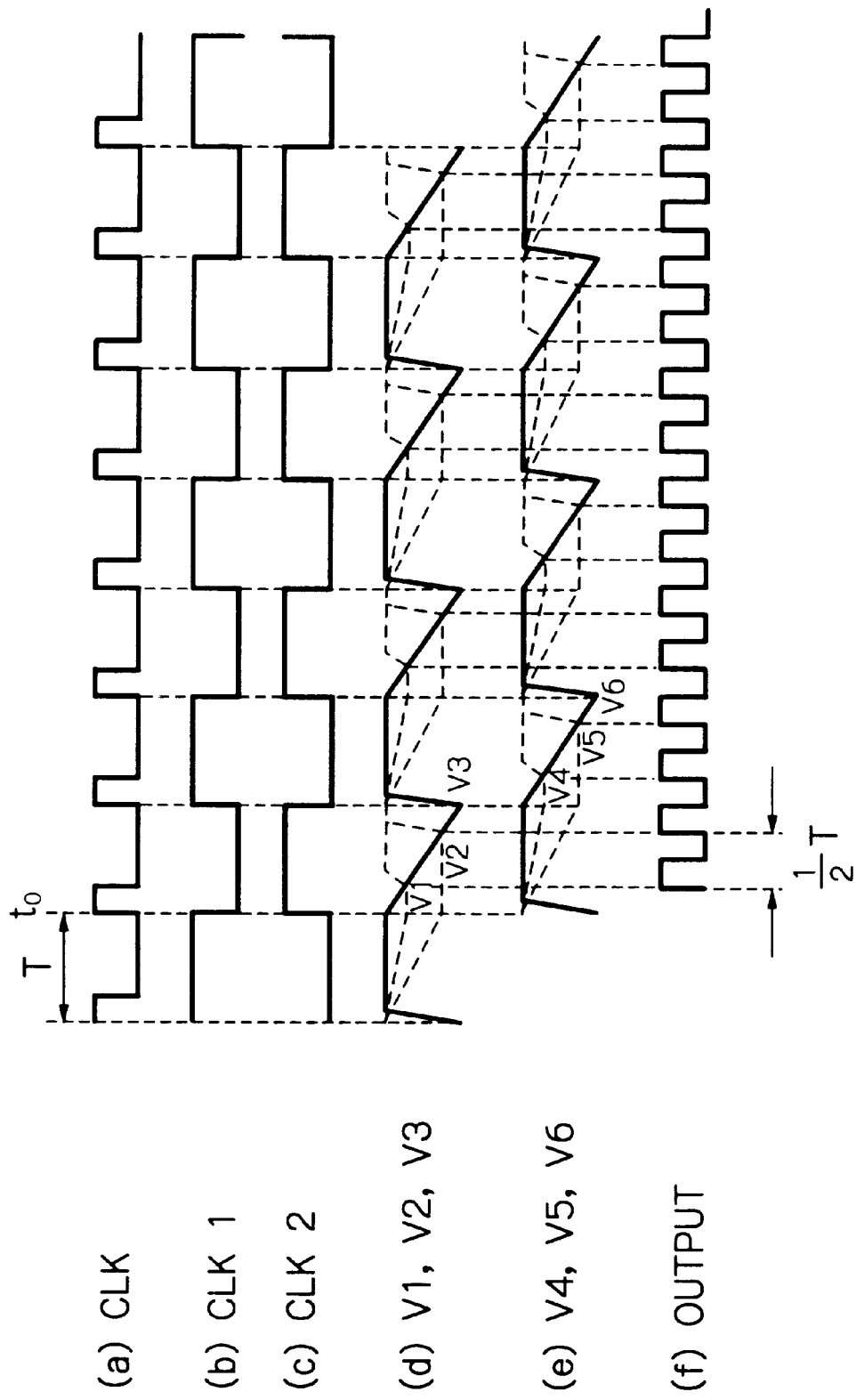

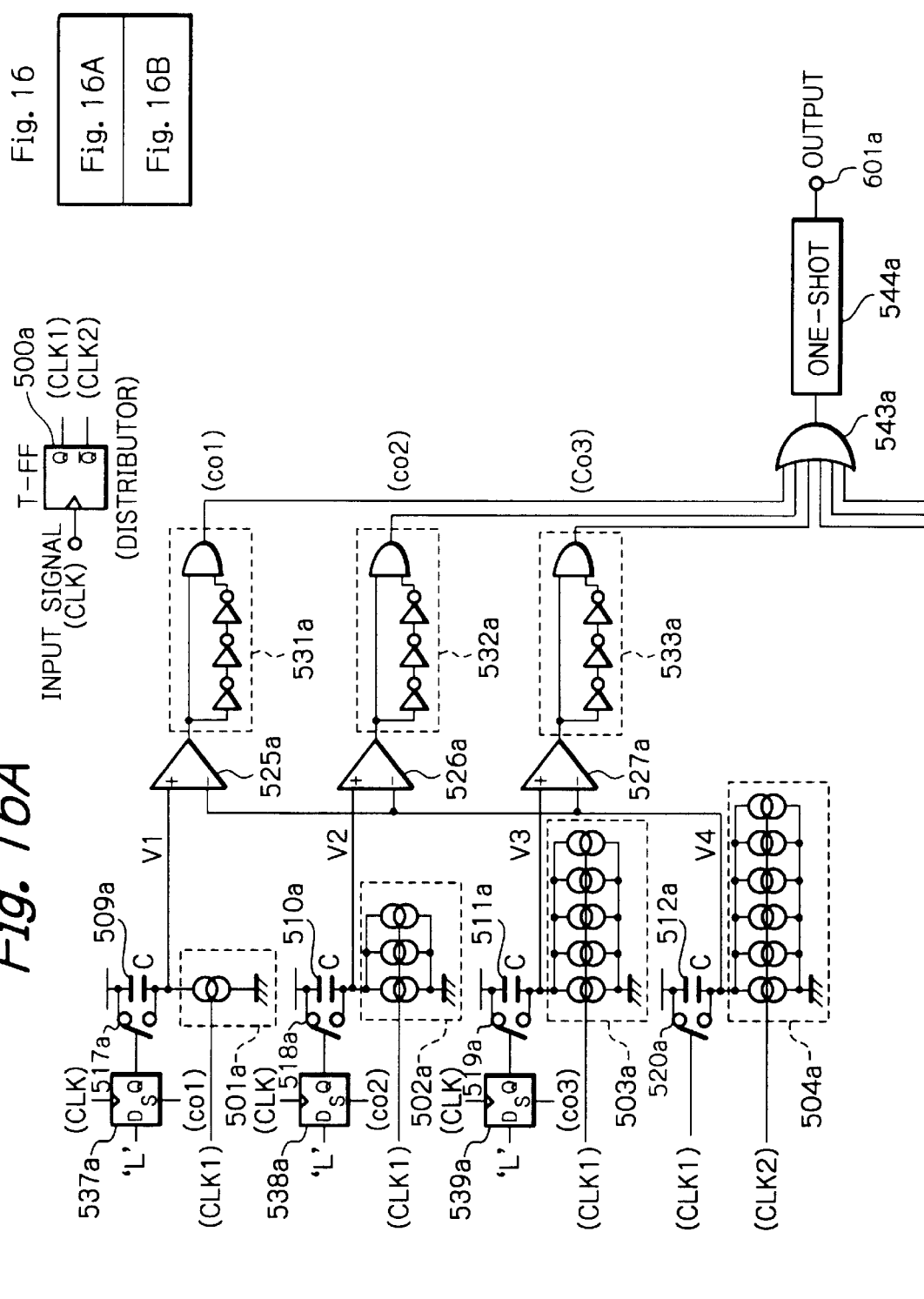

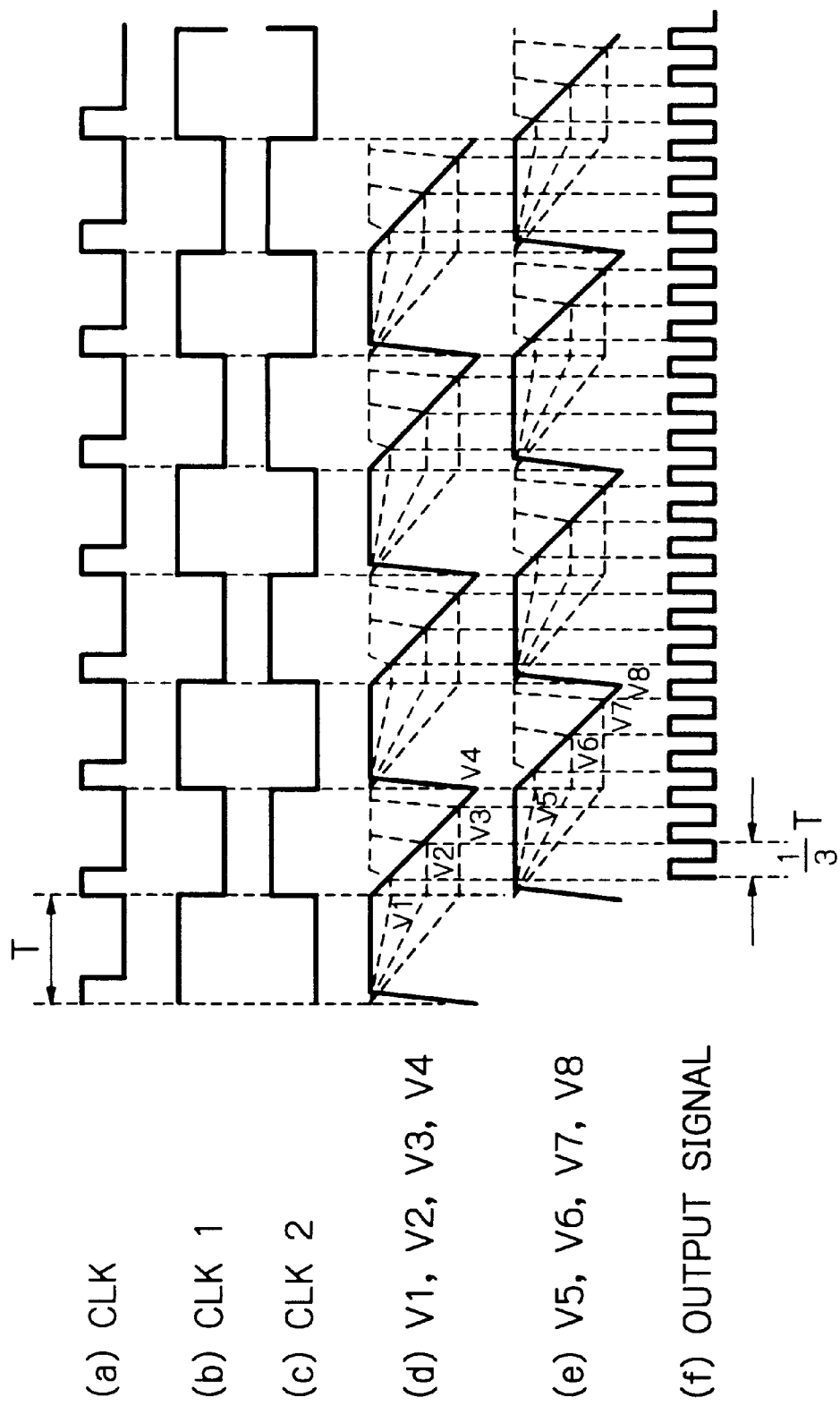

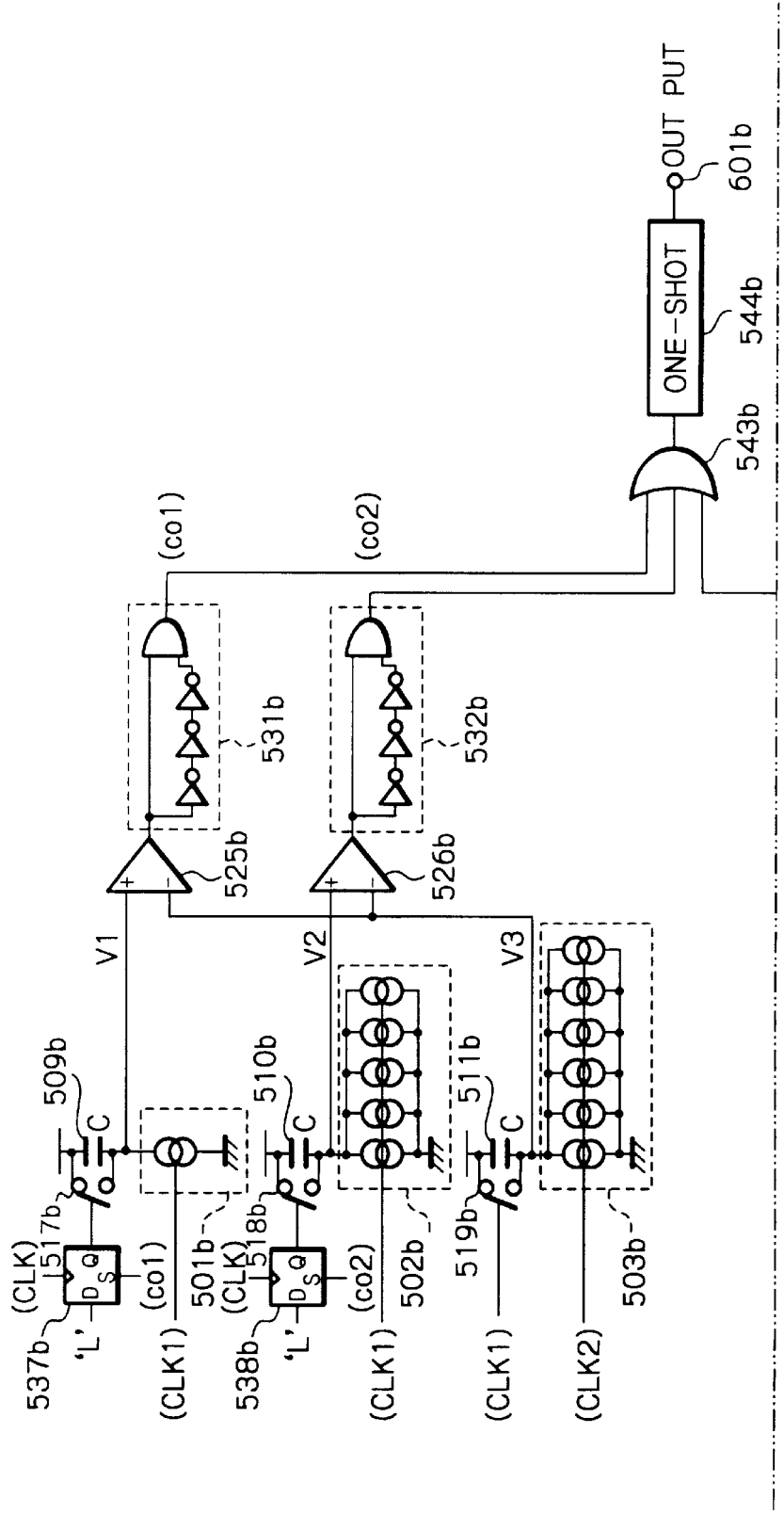

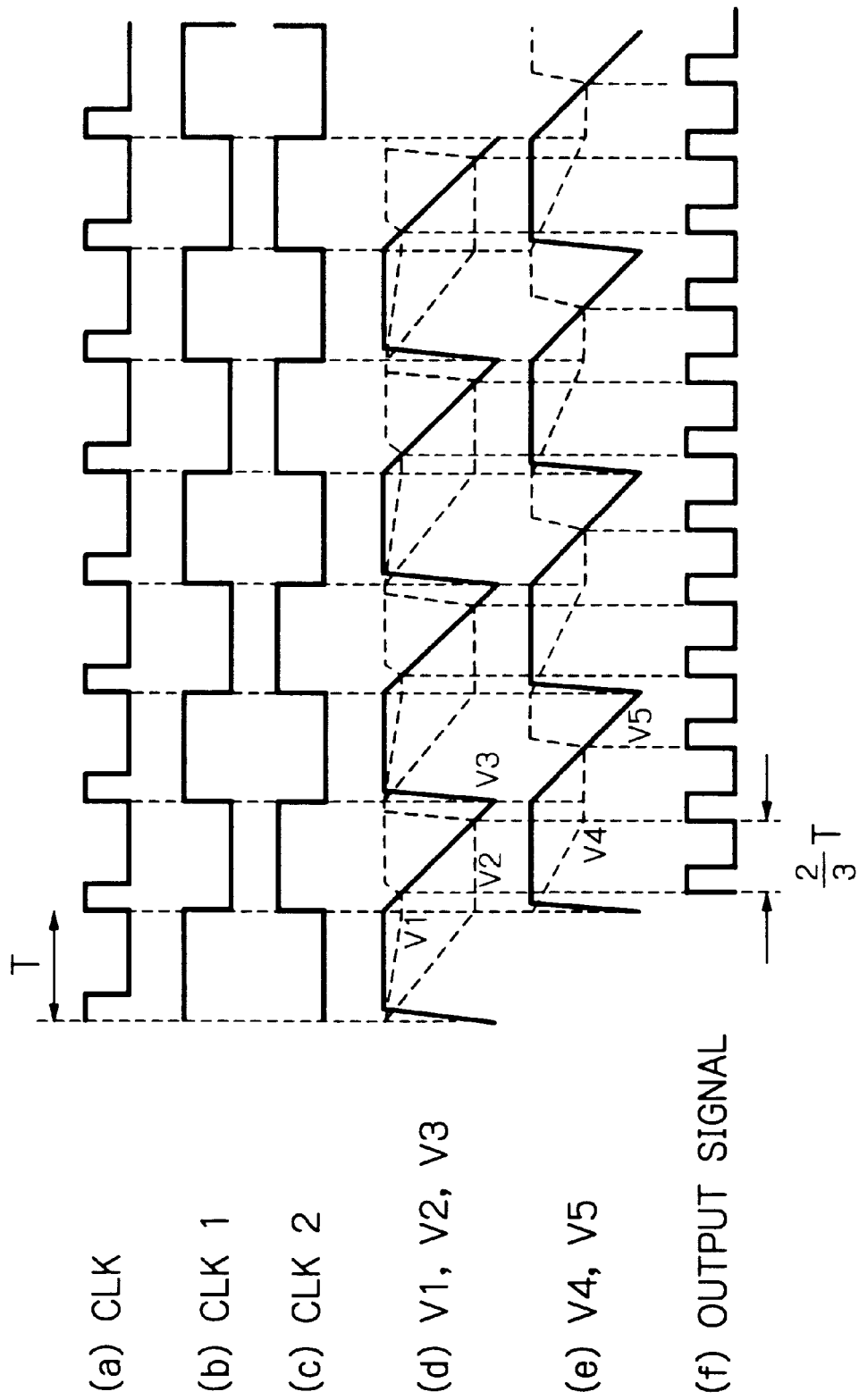

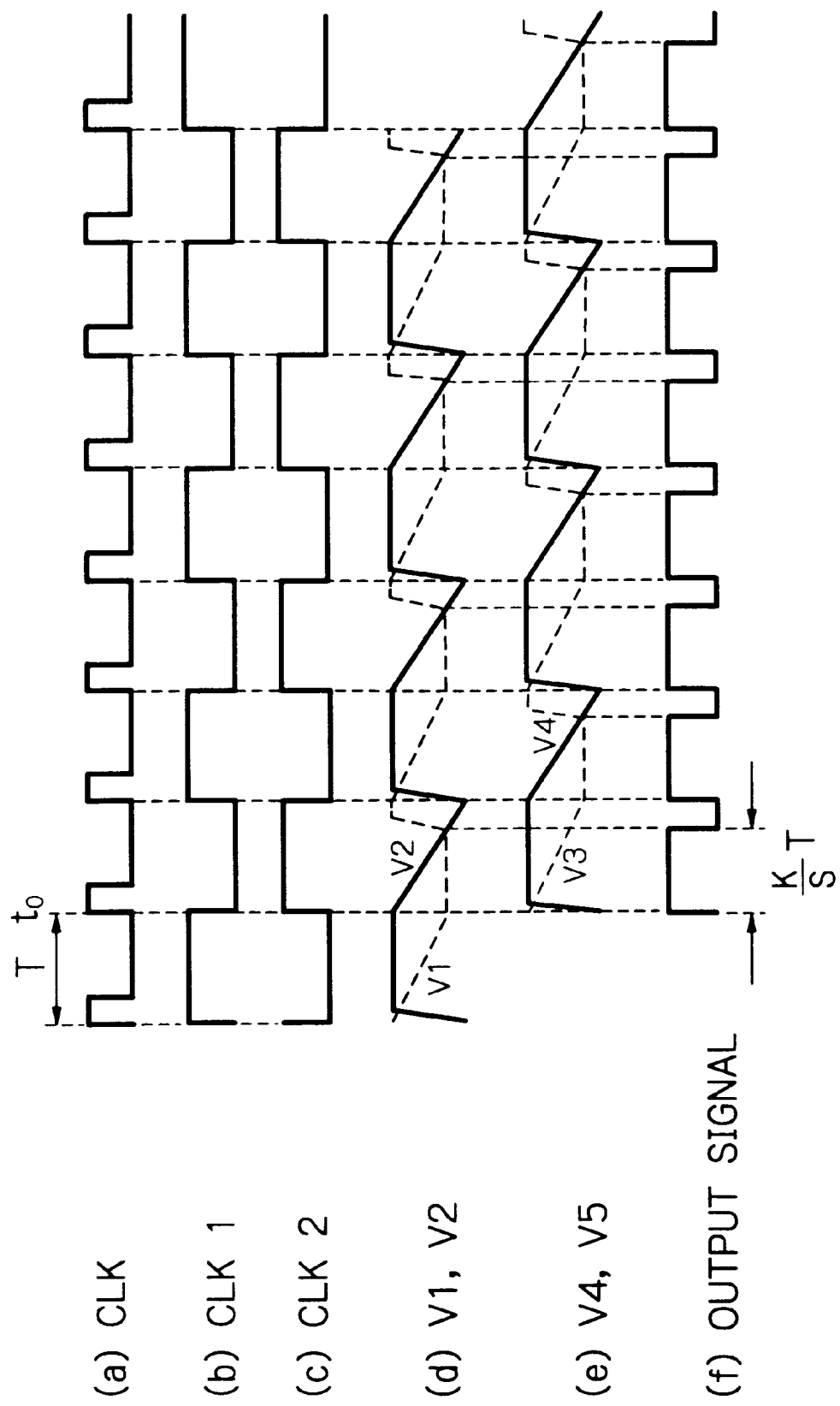

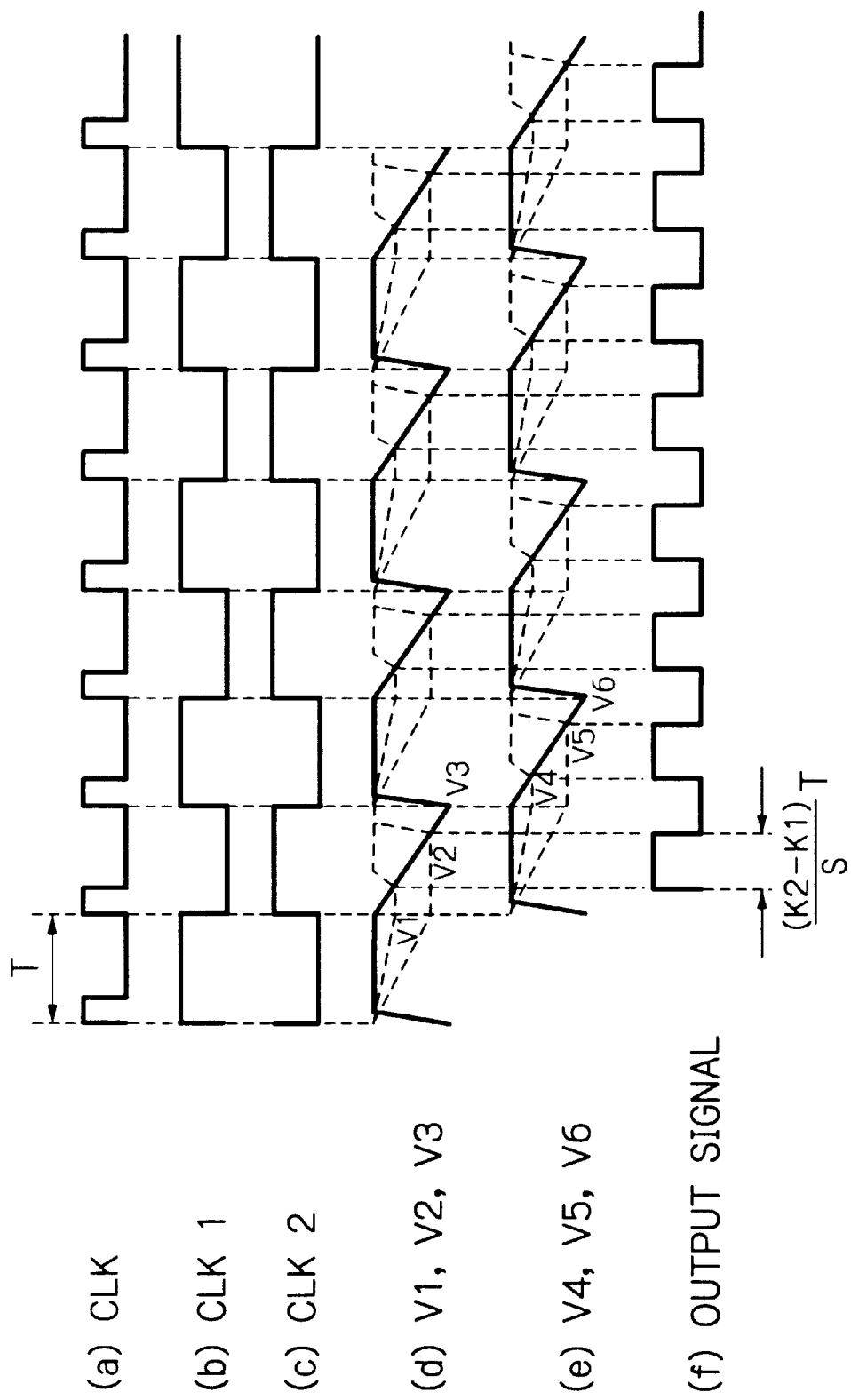

US 6,188,261 B1

PROGRAMMABLE DELAY GENERATOR AND APPLICATION CIRCUITS HAVING SAID DELAY GENERATOR

BACKGROUND OF THE INVENTION

The present invention relates to a programmable delay generator, and an application circuit using said programmable delay generator. An application circuit includes a frequency synthesizer, a frequency multiplier, a duty ratio converter, and a PLL frequency synthesizer.

The present programmable delay generator provides an output pulse which is delayed by time defined by a predetermined digital data, from an input trigger pulse.

Further, the present invention provides a frequency multiplier which uses the present programmable delay generator, and provides output frequency having integer multiple frequency of input frequency. Further, the present invention provides a duty ratio converter which uses the present programmable delay generator and converts duty ratio of an input pulse to provide an output pulse having desired duty ratio.

FIG. 12 shows a prior programmable delay generator, which is shown in pages (12-36)–(12-64) in Linear Databook, 1994/1995, published by Analog Devices Co.

In FIG. 12, a current source 82, a capacitor 83 and a switch 84 provide an integrator. A trigger circuit 81 opens or closes a switch 84 according to a leak signal 401 and a trigger signal 402, and the integrator generates ramp wave voltage Vs. A latch circuit 85 latches a set data 404 responsive of a latch signal 403, and an output of the latch circuit 85 is applied to a D/A (digital to analog) converter 86. The D/A converter 86 provides threshold voltage Vk in analog form proportional to the set data 404. A comparator 87 compares ramp wave voltage Vs with threshold voltage Vk, and provides an output pulse just when the former coincides with the latter. A one-shot multivibrator 88 receives an output of the comparator 87, and provides an output pulse having a desired pulse width to an output terminal 405.

FIG. 13 shows operational time charts of the programmable delay generator of FIG. 12. In FIG. 13, a symbol for each signal coincides with a symbol in FIG. 12. The curve (a) shows a trigger signal 402, the curve (b) shows a latch signal 403, the curve (c) shows a set data 404, the curve (d) shows a leak signal 401, the curve (e) shows a ramp wave voltage Vs across the capacitor 83, the curve (f) shows a threshold voltage Vk which is an output voltage of the D/A converter 86, and the curve (g) shows an output signal 405 which is an output of the one-shot multivibrator 88, and is an output of the current programmable delay generator.

In FIGS. 12 and 13, a set data 404 is latched in the latch circuit 85 synchronized with the latch signal 403. The D/A converter 86 provides a threshold voltage Vk in analog form proportional to the set data 404. The threshold voltage Vk is expressed as follows, where $V_0$ is unit voltage of the D/A converter 86, and K is a set data.

$$Vk = -KV_0 \quad (1)$$

A trigger signal 402 triggers the capacitor 83 to be charged by the current source 82 to generate ramp wave voltage Vs. The voltage of the ramp wave voltage Vs at time t is expressed as follows, where I is current of the current source 82, C is capacitance of the capacitor 83, and the trigger signal 402 rises at time $t_0$.

$$Vs = -(I/C)(t - t_0) \quad (2)$$

The comparator 87 detects that the ramp wave voltage Vs reaches the threshold voltage Vk. The time from $t_0$ until Vs reaches Vk, that is the delay time $t_d$ of the output signal 405 is shown as follows from the equations (1) and (2).

$$t_d = (KV_0C)/I \quad (3)$$

The output signal 405 falls when the time defined by time constant of the one-shot multivibrator 88 elapsed. And, the capacitor 83 is discharged by a leak signal 403, so that ramp wave voltage Vs is again initialized.

As described above, the prior programmable delay generator of FIG. 12 provides a delay time defined by a set data, as shown in the equation (3).

By the way, a programmable delay generator in which both a numerator and a denominator of a ratio are variable, is desired following the development of a frequency synthesizer. A fractional delay generator is essential to take a jitter free signal from an accumulator, and/or decrease spurious component in an output of a fractional N PLL frequency synthesizer.

However, a prior programmable delay generator of FIG. 12 generates a delay time defined by the equation (3), therefore, although it can provide a delay time proportional to a set data K, it can not provide a delay time defined by a denominator. Further, a delay time depends upon the circuit constants $V_0$, C and I as shown in the equation (3), and therefore, the accuracy of the circuit constants is essential to improve the accuracy of a delay time.

It should be noted in the equation (3) that the value I of a current source 82 is included in the denominator, this means that delay time depends upon denominator, however, the circuit constants $V_0$, C and I must still be controlled to improve the absolute value of a delay time.

Further, when a frequency multiplier to provide integer multiple frequency of input frequency by supplying pulses having shorter period than that of input pulses, by using a conventional programmable delay generator, is desired, or a conversion of duty ratio for converting duty ratio of input pulse by determining interval between rise time and fall time of an output pulse by using a conventional programmable delay generator is desired, specific adjustment of circuit constants must be essential for each input frequency. Even when input frequency is determined, the circuit constants including $V_0$, C, I are necessary to improve accuracy of delay time, if we use a conventional programmable delay generator.

Therefore, a prior programmable delay generator has a disadvantage that it is difficult to provide accurate delay time, and it can not be used in a frequency synthesizer which demands absolute accuracy of delay time.

SUMMARY OF THE INVENTION

It is an object of the present invention to provide a new and improved programmable delay time generator by overcoming the disadvantages and limitations of a prior programmable delay time generator.

It is also an object of the present invention to provide a programmable delay time generator which both numerator and denominator can be designed, and provides accurate delay time with no circuit adjustment.

It is also an object of the present invention to provide a frequency synthesizer which uses the present programmable delay time generator, and which provides spurious free output signal with no circuit adjustment.

It is also an object of the present invention to provide a frequency multiplier which provides spurious free multiplied output signal by using the present programmable delay time generator.

Further, it is an object of the present invention to provide duty ratio converter which provides accurate duty ratio of a pulse signal with no circuit adjustment, by using the present programmable delay generator.

The present programmable delay generator comprises; a first ramp wave generator and a second ramp wave generator, each having the same structure as each other, each of them operating with external common clock pulses, and each of them providing potential gradient and final potential incorporated with an external set data; a comparator for comparing an output ($V_s$) of the first ramp wave generator and an output ($V_k$) of the second ramp wave generator so that an output pulse is provided when the outputs of two ramp wave generators coincide with each other; said first ramp wave generator providing a first ramp voltage ($V_s$) upon receipt of a first set data (S) at a predetermined time ($t_0$); said second ramp wave generator providing a threshold voltage ($V_k$) upon receipt of a second set data (K) at a time which preceds at least one clock time (T) than said predetermined time; said comparator providing an output pulse delayed by delay time ($t_d$) which is proportional to ratio of said second set data and said first set data from said predetermined time.

In the above structure, when ramp wave voltage Vs is compared with threshold voltage Vk, an error in both voltages to affect delay time is cancelled. Further, delay time is determined by ratio of set data K and S, thus, fractional delay time is obtained with no circuit adjustment.

Further, the present programmable delay time generator has a threshold voltage generator and a ramp wave generator operate with an external clock pulse so that absolute accuracy of delay time is improved.

The present frequency synthesizer uses the present programmable delay generator as phase interpolation means in a direct digital synthesizer, so that spurious free output signal is obtained since any delay time is obtained with no circuit adjustment.

The present frequency multiplier uses the present programmable delay generator to generate pulses having shorter interval than that of an input signal so that output pulses with equal interval is obtained with no circuit adjustment. Thus, spurious free output with no jitter is obtained.

The present duty ratio converter uses the present programmable delay generator to determine pulse width of an output pulse, so that precise duty ratio conversion is obtained with no circuit adjustment.

BRIEF DESCRIPTION OF THE DRAWINGS

The foregoing and other objects, features, and attendant advantages of the present invention will be appreciated as the same become better understood by means of the following description and the accompanying drawings wherein;

FIG. 7 shows operational time charts of the frequency synthesizer in FIG. 6, FIG. 15 shows operational time charts of the frequency multiplier in FIG. 14, FIG. 17 shows operational time charts of the frequency multiplier in FIG. 16, FIG. 19 shows operational time charts of the frequency multiplier in FIG. 18, FIG. 23 shows operational time charts of the duty ratio converter in FIG. 22, FIG. 25 shows operational time charts of the duty ratio converter in FIG. 24.

DESCRIPTION OF THE PREFERRED EMBODIMENTS (First Embodiment of a Programmable Delay Generator)

Figure 1:
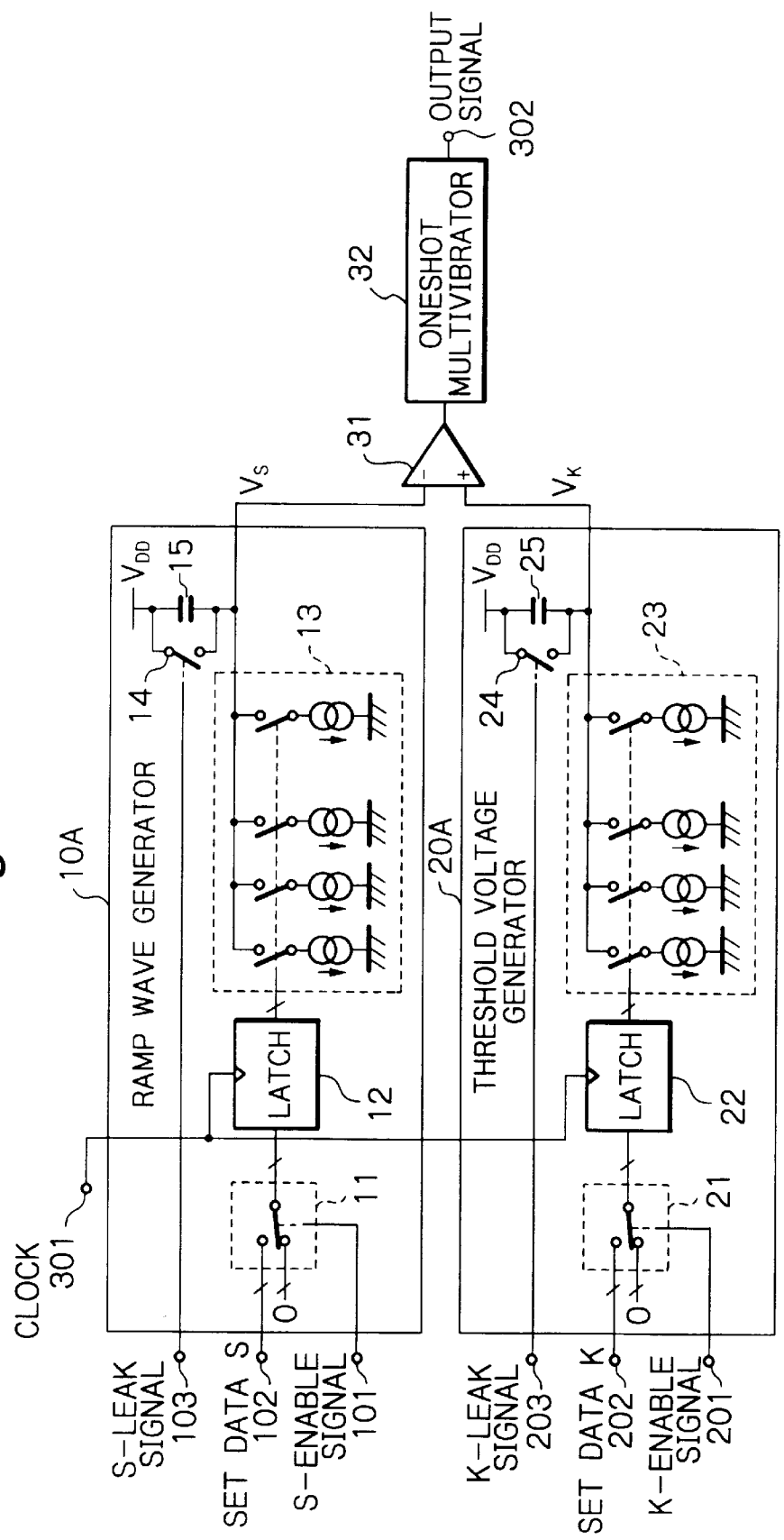
FIG. 1 is a block diagram of a first embodiment of a programmable delay generator according to the present invention.

FIG. 1 is a block diagram of a first embodiment of a programmable delay generator according to the present invention.

In the figure, a ramp wave generator 10A has a data selector 11, a latch circuit 12, a current switch array 13, a switch 14, a capacitor 15, an input terminal 101 for S-enable signal, an input terminal 102 for a set data S, an input terminal 103 for an S leak signal. The capacitor 15 generates ramp wave voltage Vs across the capacitor 15.

A threshold voltage generator 20A has a data selector 21, a latch circuit 22, a current switch array 23, a switch 24, a capacitor 25, an input terminal 201 for K-enable signal, an input terminal 202 for a set data K, and an input terminal 203 for a K leak signal. The threshold voltage Vk is generated across the capacitor 25.

A clock signal input terminal 301 is coupled with both the ramp wave generator 10A and the threshold voltage generator 20A so that common clock signal is provided to both the generators.

The structure and the circuit constants of the components of the ramp wave generator 10A are the same as those of the threshold voltage generator 20A. Thus, the capacitance of the capacitor 15 is the same as that of the capacitance 25, a unit current $I_0$ of the current switch array 13 is the same as that of the current switch array 23. Preferably, a ramp wave generator 10A and a threshold voltage generator 20A are mounted on a common substrate so that the same structure and the same circuit constants are simply obtained.

A comparator 31 compares ramp wave voltage Vs with threshold voltage Vk, and provides an output pulse when the former (Vs) is equal to the latter (Vk). A one-shot multivibrator 302 receives an output of the comparator 31, and provides an output pulse having a desired pulse width to an output terminal 302.

Figure 2:
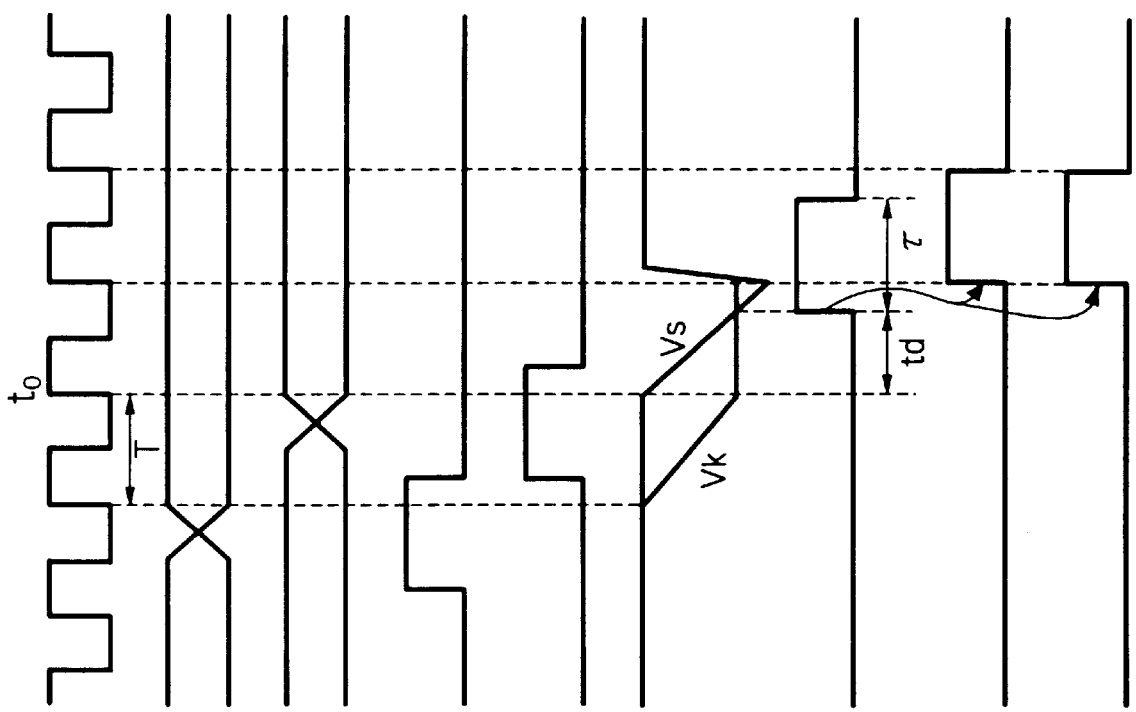
FIG. 2 shows operational time charts of the programmable delay generator in FIG. 1.

FIG. 2 shows operational time charts of the programmable delay generator of FIG. 1. The same symbols in FIG. 2 show signals at terminals of the same symbols in FIG. 1.

The curve (a) shows a clock signal 301, the curve (b) shows a set data K, the curve (c) shows a set data S, the curve (d) shows a K-enable signal 201, the curve (e) shows an S-enable signal 101, the curve (f) shows a threshold voltage Vk, the curve (g) shows a ramp wave voltage Vs, the curve (h) shows an output signal 302, the curve (i) shows a K-leak signal 203, and the curve (j) shows an S-leak signal 103.

It is supposed that a K-enable signal 201 which rises earlier than an S-enable signal 101 at least one clock cycle T. When the K-enable signal 201 rises, the data selector 21 couples the input terminal 202 for the set data K with the latch circuit 22. The latch circuit 22 takes the set data K of the input terminal 202 for the set data K at a first rise of a clock signal 301 after the K-enable signal 201 is applied. Then, the current switch array 23 flows current proportional to the set data K, and the threshold voltage Vk across the capacitor 25 decreases linearly. The threshold voltage Vk at time t after the threshold voltage begins to decrease ($t_0-T \leq t \leq t_0$) is shown below, where $t_0$ is a time that a clock signal 301 rises first after the threshold voltage Vk begins to decrease, T is period of a clock signal.

$$Vk = -(KI_0/C)(t-t_0+T) \quad (4)$$

The K-enable signal 201 falls between $t_0-T$ and $t_0$, and an S-enable signal 103 rises. Then, the data selector 21 couples the latch circuit 22 with an initial value 0 at time $t_0$ so that the current switch array 23 becomes off, and the decrease of the threshold voltage Vk stops, and the threshold voltage Vk becomes constant. The decrease of the threshold voltage Vk continues for 1 clock period T. The threshold voltage Vk after ($t \geq t_0$) is;

$$Vk = -(KI_0/C)T \quad (5)$$

On the other hand, the ramp wave generator 10A takes a set data S on an input terminal 102 for a set data S at time $t_0$ through a data selector 11. Then, the current switch array 13 flows current proportional to the set data S, and then, the ramp voltage across the capacitor 15 begins to decrease. The ramp voltage Vs at time t after $t_0$ is;

$$Vs = -(SI_0/C)(t-t_0) \quad (6)$$

The comparator 31 detects if the threshold voltage Vk coincides with the ramp voltage Vs. The delay time $t_d (=t-t_0)$ after $t_0$ until the ramp voltage Vs coincides with the threshold voltage Vk, that is the time until the output signal 302 rises is derived by the equations (5) and (6).

$$t_d = (K/S)T \quad (7)$$

The output signal 302 falls when the time constant of the one-shot multivibrator 32 elapsed.

The capacitors 25 and 15 are discharged by the fall of the K-leak signal 203, and the S-leak signal 103, respectively. Then, the threshold voltage Vk and the ramp wave voltage Vs return to an initial value. Each of the leak signals may be anytime after an output signal 302 is output following the coincidence of Vk and Vs. In FIG. 2, both leak signals rise at time $t_0+T$, alternatively, an output signal 302 may be fedback for each of leak signals.

As described above, the present programmable delay generator generates fractional delay time proportional to ratio K/S expressed by the equation (7). The numerator K and the denominator S of the fraction are set data which may be designed arbitrary. Therefore, any fractional delay time is obtained.

It should be noted that the equation (7) does not include the circuit constants, since the structure and the circuit constants of the ramp wave generator 10A are the same as those of the threshold voltage generator 20A, that is, the capacitance of the capacitor 15 is the same as that of the capacitor 25, and the unit current $I_0$ of the current switch array 13 is the same as that of the current switch array 23. When a ramp wave generator is the same as a threshold voltage generator, no fine adjustment is essential and no error occurs for a delay time, although any component has an error, Further, it should be noted that operation of a ramp wave generator and a threshold voltage generator is synchronized with an external clock signal 301, and the duration that the threshold voltage Vk decreases is accurately synchronized with the clock signal, the accuracy of absolute delay time is improved.

(Second Embodiment of a Programmable Delay Generator)

Figure 3:
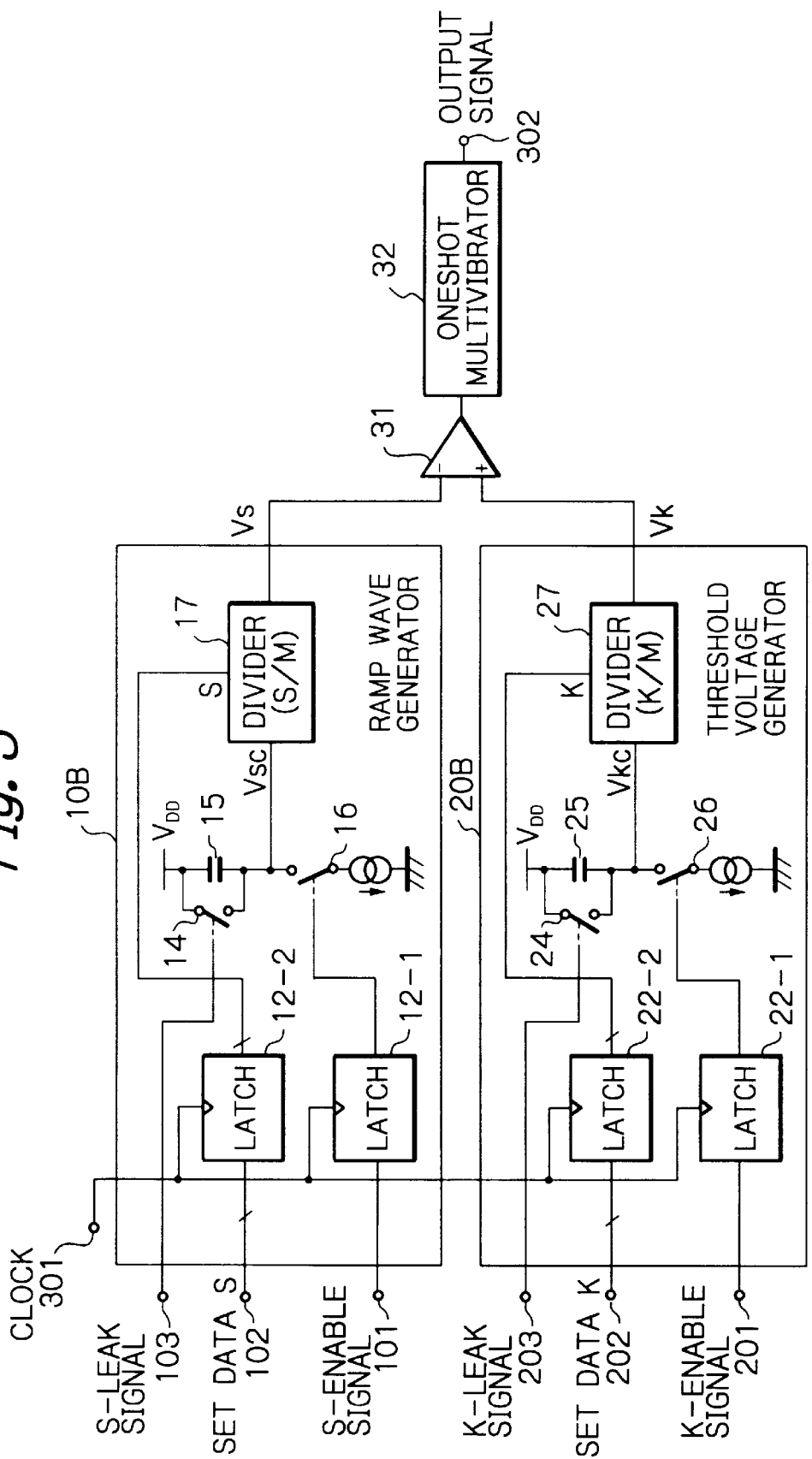
FIG. 3 is a block diagram of a second embodiment of a programmable delay generator according to the present invention.

FIG. 3 shows a block diagram of a second embodiment of a programmable delay generator according to the present invention. In the figure, a ramp wave generator 10B has latch circuits 12-1 and 12-2, a current switch 16, a capacitor 15, a voltage divider 17, an input terminal 101 for S-enable signal, an input terminal 102 for S set data, and an input terminal 103 for S-leak signal. The voltage Vsc across the capacitor 15 is divided by the voltage divider 17 which provides ramp wave voltage Vs.

A threshold voltage generator 20B has latch circuits 22-1 and 22-2, a current switch 26, a switch 24, a capacitor 25, a voltage divider 27, an input terminal 201 for K-enable signal, an input terminal 202 for K set data, and an input terminal 203 for K-leak signal. The voltage Vkc across the capacitor 25 is divided by the voltage divider 27 which provides a threshold voltage Vk. A clock signal is applied commonly to both the ramp wave generator 10B and the threshold voltage generator 20B through an input terminal 301.

The structure and the circuit constants of the ramp wave generator 10B are the same as those of the threshold voltage generator 20B, thus, the capacitance C of the capacitor 15 is the same as that of the capacitor 25, the current $I_0$ of the current switch 16 is the same as that of the current switch 26, and the divide ratio M of the divider 17 is the same as that of the divider 27. Those conditions are satisfied easily by mounting a ramp wave generator and a threshold voltage generator on a common substrate.

A comparator 31 compares a ramp wave voltage Vs with a threshold voltage Vk, and provides an output pulse when the former Vs coincides with the latter Vk. A one-shot multivibrator 32 receives an output of the comparator 31, and provides an output pulse having a predetermined pulse width defined by a time constant of the one-shot multivibrator 32 to an output terminal 302.

Figure 4:
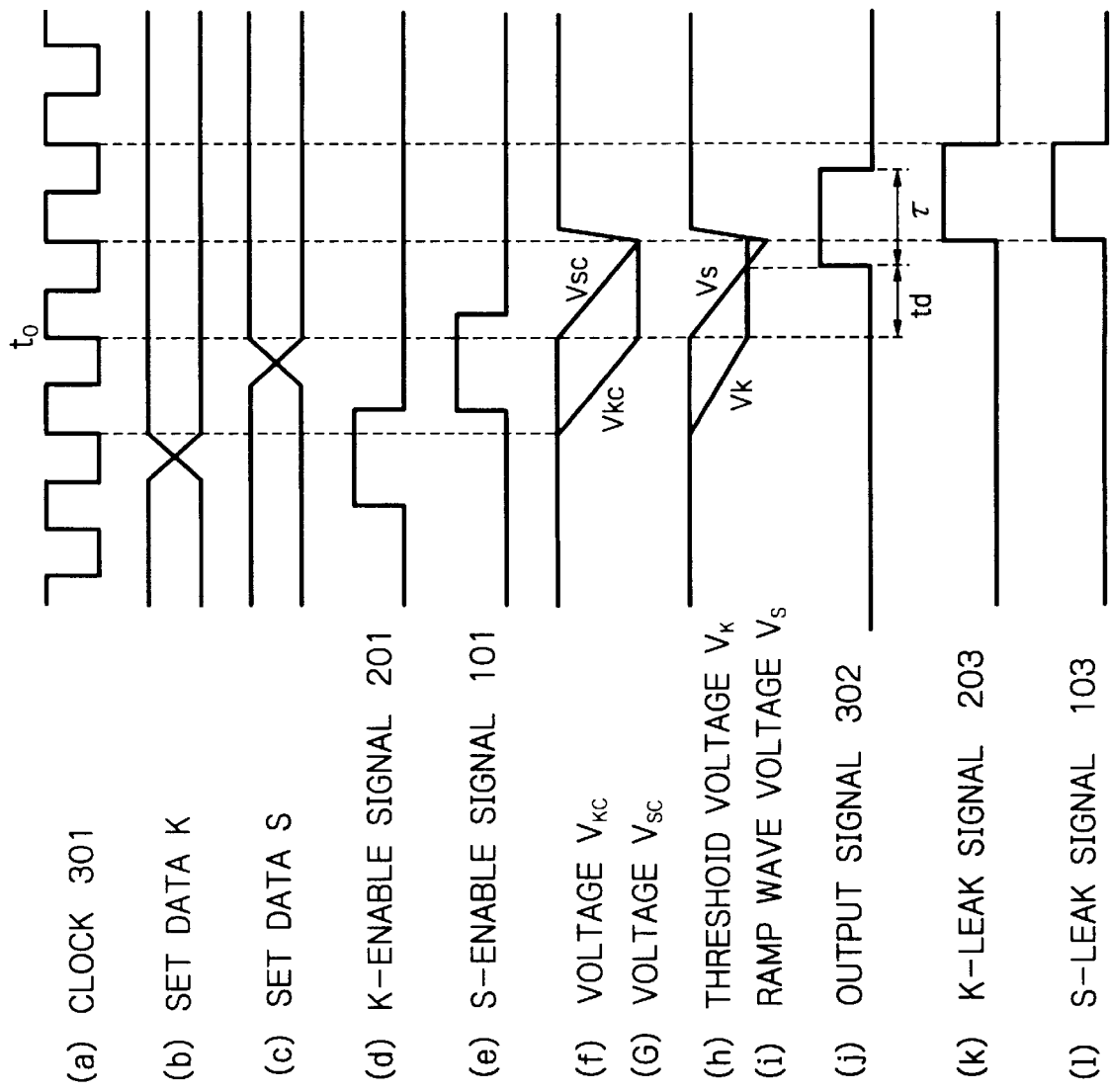
FIG. 4 shows operational time charts of the programmable delay generator in FIG. 3.

FIG. 4 shows operational time charts of the circuit of FIG. 3. The symbols in FIG. 4 show signals at the same terminals as those in FIG. 3. The curve (a) shows a clock signal 301, the curve (b) shows a set data K, the curve (c) shows a set data S, the curve (d) shows a K-enable signal, the curve (e) shows an S-enable signal, the curve (f) shows the voltage Vkc across the capacitor 25, the curve (g) shows the voltage Vsc across the capacitor 15, the curve (h) shows the threshold voltage Vk, the curve (i) shows the ramp wave voltage Vs, the curve (j) shows an output signal 302, the curve (k) shows a K-leak signal 203, and the curve (l) shows an S-leak signal 103.

First, a set data K is applied to an input terminal 202 for a K-set data, and a K-enable signal 201 rises. The latch circuit 22-1 takes a K-enable signal 201 at time synchronized with rise of a clock signal 301, and the latch circuit 22-2 takes a K set data at time synchronized with rise of a clock signal 301. The current switch 26 begins to flow current $I_0$ at that rise time, then, the voltage Vkc across the capacitor 25 decreases. The voltage Vkc at time t after the voltage Vkc begins to decrease ($t_0-T \leq t \leq t_0$) is shown below, where $t_0$ is first rise of a clock signal after the voltage across the capacitor begins to decrease, the period of a clock signal is T.

$$Vkc = -(I_0/C)(t - t_0 + T) \tag{8}$$

The K-enable signal 201 falls and the S-enable signal 101 rises between $t_0-T$ and $t_0$. Then, the latch circuit 22-1 gets off the current switch 26 at time $t_0$, the decrease of the voltage Vkc across the capacitor stops, and that voltage becomes constant. The voltage Vkc after that time ($t > t_0$) is;

$$Vkc = -(I_0/C)T \tag{9}$$

The voltage Vkc across the capacitor is applied to the divider 27, which provides the threshold voltage Vk proportional to the set data K kept in the latch circuit 22-2. The threshold voltage Vk of the output of the divider 27 is;

$$Vk = (K/M)Vkc \tag{10}$$

It is assumed that the divide ratio M determined by the structure of the divider, and is equal to or larger than the maximum value of K. When a divider 27 is a conventional R-2R resistance network, or a potentiometer type resistance network, M is equal to the maximum value of K plus 1. If an input impedance of a voltage divider 27 is not sufficiently high as compared with an output impedance of an integrator composed of a switch 24, a capacitor 25 and a current switch 26, an impedance converter in the form of a voltage follower is preferably inserted between an integrator and a voltage divider.

The threshold voltage Vk is shown from the equations (9) and (10) as follows.

$$Vk = -(K/M)(I_0/C)T \tag{11}$$

On the other hand, at time $t_0$, the latch circuit 12-1 in the ramp wave generator 10B takes an S-enable signal through an input terminal 101 for an S-enable signal, and the latch circuit 12-2 takes a set data S through an input terminal 102 for an S set data. The current switch 16 begins to flow current at that time $t_0$, and the voltage Vsc across the capacitor 15 begins to decrease. The voltage Vsc at time t after $t_0$ is as follows.

$$Vsc = -(I_0/C)(t - t_0) \tag{12}$$

The voltage Vsc is applied to the voltage divider 17, which provides a ramp wave voltage Vs proportional to a set data S held in the latch circuit 12-2. The ramp wave voltage Vs of the output of the divider 17 is;

$$Vs = -(S/M)(I_0/C)(t - t_0) \tag{13}$$

The comparator 31 detects that the ramp wave voltage Vs coincides with the threshold voltage Vk. The delay time $t_d (= t - t_0)$ from time $t_0$ until Vs coincides with Vk, in other words, the time until an output signal 302 rises is shown as follows from the equations (11) and (13).

$$t_d = (K/S)T \tag{14}$$

The output signal 302 falls after the time constant of the one-shot multivibrator 32 elapsed.

The capacitors 25 and 15 are discharged at rise of the K-leak signal 203 and the S-leak signal 103, respectively, so that the threshold voltage Vk (and the capacitor voltage Vkc) and the ramp wave voltage Vs return to initial value. The timing of each leak signal may be anytime after an output signal 302 is provided following the detection of coincidence of Vs and Vk. Although FIG. 4 shows the case that both leak signals rise at $t_0+T$, and fall at $t_0+2T$, the leak signals may be a feedback signal of an output signal 302.

As described above, the second embodiment of the present invention provides a delay time proportional to fraction K/S defined by the equation (14). The values K and S which define the fraction are set data which are arbitrary determined. therefore, a delay time defined by fraction is obtained.

It should be noted that the equation (14) does not include a circuit constant, since the circuit constants of a ramp wave generator 10B are the same as those of a threshold voltage generator 20B, that is to say, the capacitance of a capacitor 15 is the same as that of a capacitor 25, current $I_0$ of a current switch 16 is the same as that of a current switch 26, and divide ratio M of a divider 17 is the same as that of a divider 27. As a ramp wave generator 10B is the same as a threshold voltage generator 20B, no circuit adjustment is necessary and a delay time has no error even when a circuit constant has some error. Further, since a ramp wave generator 10B and a threshold voltage generator 20B are synchronized with an external clock signal 301, and the duration that the threshold voltage Vk decreases is accurately synchronized with the clock signal, the accuracy of delay time obtained is improved.

(First Embodiment of a Frequency Synthesizer)

Figure 5:
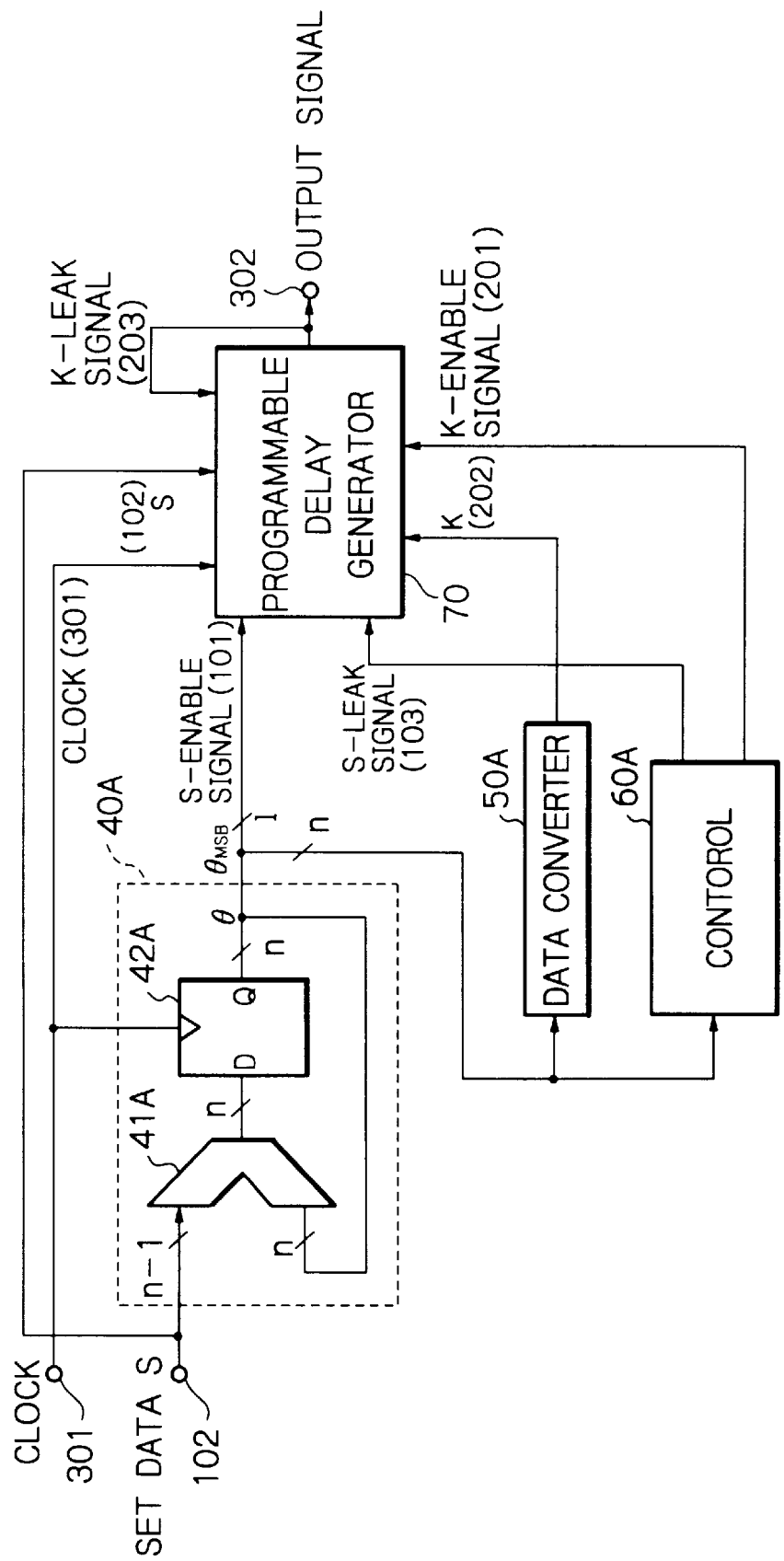
FIG. 5 is a block diagram of a first embodiment of a frequency synthesizer according to the present invention.

FIG. 5 is a block diagram of a first embodiment of a frequency synthesizer which uses a programmable delay generator according to the present invention. In the figure, the frequency synthesizer has an accumulator 40A, a data converter 50A, a control circuit 60A, and a programmable delay generator 70. The accumulator 40A has an adder 41A and a latch circuit 42A. A set data S applied to an input terminal 102 for a set data is input to an adder 41A of the accumulator 40A, and the programmable delay generator 70A. A clock signal applied to a clock signal input terminal 301 is input to the latch circuit 42A of the accumulator 40A, and the programmable delay generator 70.

Figure 6:
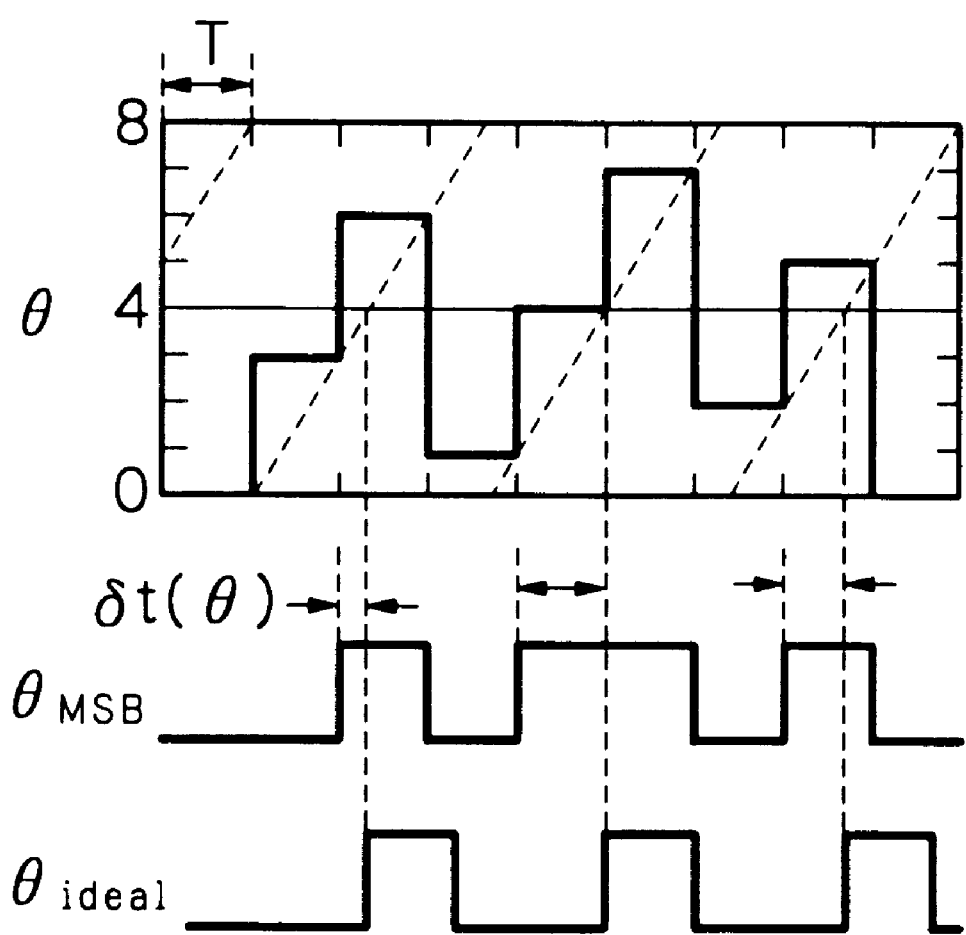
FIG. 6 shows explanatory figure of the operation of an accumulator 40A in FIG. 5.

FIG. 6 is an explanatory drawing for the explanation of the operation of the accumulator 40A. It is assumed that the number of bits of the accumulator is n=3, and the set data S is 3. The most significant bit $\theta_{MSB}$ of an output data $\theta$ of the accumulator includes S=3 pulses during $2^n=8$ clock periods. Therefore, the average frequency $f_0$ is shown below, where $f_{CLK}$ is clock frequency.

$$f_0 = (S/2^n)f_{CLK} \quad (15)$$

This accumulator itself is the simplest form of a direct digital synthesizer, and may be used for calculation of phase signal by other direct digital synthesizers.

However, an accumulator itself has much jitter in an output signal $\theta_{MSB}$ as shown in FIG. 6. Jitter provides undesired spurious component in frequency spectrum, therefore, a mere accumulator can not be used as a local oscillator of a radio communication system due to jitter. In a prior art, a ROM (read only memory) has been used to generate sine wave.

Another prior art for suppressing jitter is phase interpolation as described in V. Reinhardt et al., "A short survey of frequency synthesizer techniques", in Proc. 40th Annual Frequency Control Symp., pp. 355–365, May 1986. A phase interpolation provides a delayed signal $\theta_{ideal}$ as shown in FIG. 6 by delaying each pulse of an output signal $\theta_{MSB}$. An amount of delay $\Delta_t$ of a pulse is as follows, where $\theta_p$ is value of $\theta$ immediate before $\theta_{MSB}$ rises.

$$\Delta_t = ((2^{n-1} - \theta_p)/S)T \quad (16)$$

For instance, as the value $\theta_p$ immediate before the first $\theta_{MSB}$ rises is 3, the first $\theta_{MSB}$ is delayed by $$\Delta_t = ((4-3)/3)T = T/3$$

then, the delayed pulse coincides with the first pulse of $\theta_{ideal}$.

Figure 12:
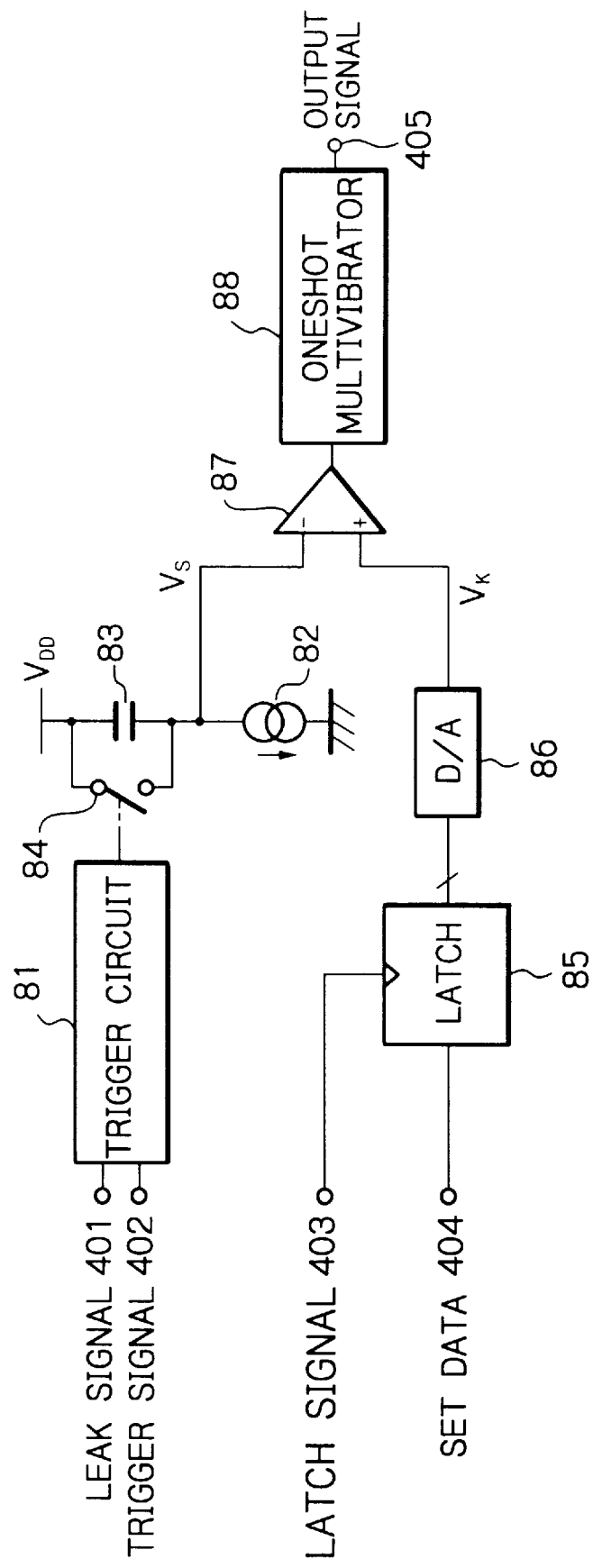
FIG. 12 is a block diagram of a programmable delay generator in a prior art.
Figure 13:
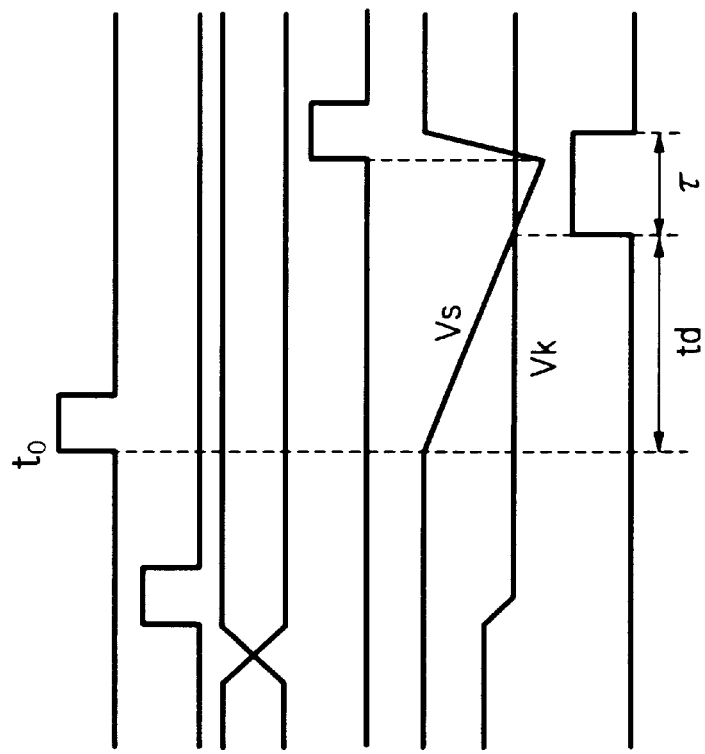
FIG. 13 shows operational time charts of a prior programmable delay generator in FIG. 12.

Another prior interpolation system uses a prior delay generator of FIG. 12 as described in H. Nosaka et al., "A phase interpolation direct digital synthesizer with a digitally controlled delay generator", in 1997 Symp. VLSI Circuits Dig., pp. 75–76, June 1997.

Still another prior interpolation system uses a tapped delay generator as described in (V. N. Kochemasov et al., "Digital-computer synthesizers of two-level signals with phase-error compensation", Telecommunications and radio engineering, vol. 36–37, pp. 55–59, October, 1982).

However, those prior arts have the disadvantages that circuit components must be adjusted to provide accurate delay time, and, it is difficult to adjust a unit delay time.

The present programmable delay generator can provide any delay time with no adjustment of a circuit component, and therefore, a direct digital synthesizer using the present programmable delay generator as shown in FIG. 5 provides spurious-free output signal with no adjustment of a circuit component.

In FIG. 5, an output data $\theta$ of the accumulator 40A is applied to the data converter 50A and the control circuit 60A, and further the most significant bit $\theta_{MSB}$ of the output data is applied to the programmable delay generator 70 as an S-enable signal 101. The S-enable signal 101 functions to start a delay in a programmable delay generator.

The data converter 50A calculates the numerator $2^{n-1} - \theta_p$ of the equation (16), and provides the set data K which is provided to the programmable delay generator 70. The data converter 50A may be implemented either by a subtractor for carrying out the subtraction, or 2's complement calculation which is simpler (each bit of $\theta_p$ is inverted, and then 1 is added).

The control circuit 60A is implemented by a simple digital circuit which provides an S-leak signal 103 by inverting the most significant bit $\theta_{MSB}$ which is then delayed by 1 clock time, and a K-enable signal 201 which rises before the rise of $\theta_{MSB}$ by 1 clock time and has pulse width of clock period T.

An output of the programmable delay generator 70 is applied to an output terminal 302, and is feedback as a K-leak signal 203.

In the above structure, the programmable delay generator 70 provides a delay time defined by the equation (16), therefore, the frequency synthesizer in FIG. 5 generates spurious free rectangular wave defined by the equation (15).

FIG. 7 shows time charts showing the operation of the apparatus of FIG. 5. The curve (a) shows a clock signal 301, the curve (b) shows an output data $\theta$ of the accumulator 40A, the curve (c) shows the most significant bit $\theta_{MSB}$ of the output data $\theta$, the curve (d) shows a ramp wave voltage Vs, the curve (e) shows a K-enable signal 201, the curve (f) shows a threshold voltage Vk, the curve (g) shows an output signal 302, the curve (h) shows a K-leak signal 203, and the curve (i) shows an S-leak signal 103.

It is assumed in the embodiment that the number n of bits of the accumulator 40A is n=3, and the set data S is 3. Further, it is assumed that the timing after 1 clock period of the rise of the most significant bit $\theta_{MSB}$ is $t_0$ which initiates delay operation.

The amplitude of the ramp wave voltage Vs is proportional to the set data S, and is synchronized with delay of $\theta_{MSB}$ (S-enable signal 101) by 1 clock period. The K-enable signal 201 rises before the rise of $\theta_{MSB}$ by 1 clock period, and has the pulse width equal to 1 clock period. The threshold voltage Vk is triggered by the K-enable signal 201, and has the amplitude proportional to the set data K ($=2^{n-1} - \theta_p$) with pulse width of 1 clock period.

When the ramp wave voltage Vs reaches the threshold voltage Vk, an output pulse 302 having pulse width defined by a one-shod multivibrator is output. The output signal 302 is feedback as a K-leak signal 203 to the programmable delay generator 70 so that the threshold voltage Vk is reset for next cycle of operation. The S-leak signal 103 is a one clock delayed signal of the inversion of the most significant bit $\theta_{MSB}$ to reset the ramp wave voltage Vs.

A jitter free output signal 302 with pulses arranged with equal interval is thus obtained.

If a toggle flip-flop (T-FF) is attached to an output terminal, an output signal has duty ratio of 50%. In that case, the fundamental frequency is half of that defined by the equation (15).

Figure 8:
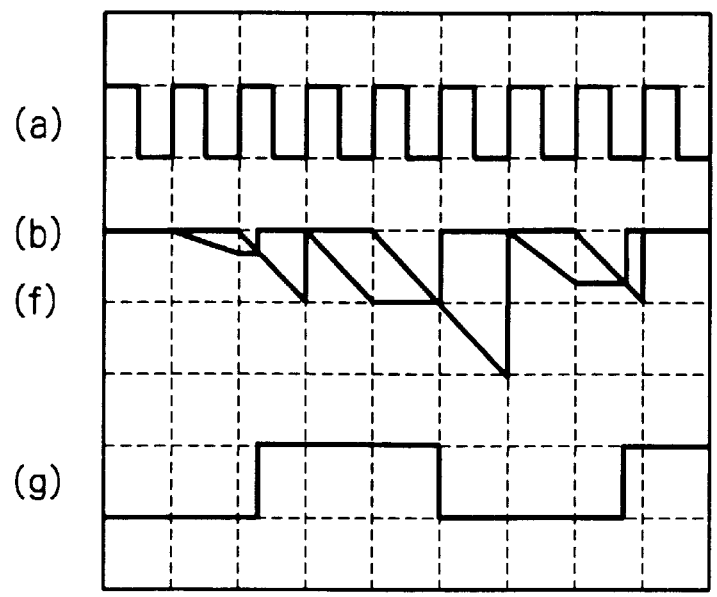
FIG. 8 shows experimental curves of the frequency synthesizer in FIG. 5.

FIG. 8 shows experimental curves of the frequency synthesizer of FIG. 5, using the programmable delay generator of FIG. 1, and a digital circuit implemented by a CMOS standard logic circuit. The clock frequency is 200 kHz, the number of bits of the accumulator 40A is n=8, the set data S is 96, and the fundamental frequency $f_0$ of the programmable delay generator 70 is given as follows by the equation (15).

$$f_0 = (96/256)f_{CLK} = (3/8)f_{CLK} = 75 \text{ kHz}.$$

In the experiment, a T-FF is added to an output terminal so that rectangular wave with 50% duty ratio is obtained. Thus, the output frequency is 37.5 kHz. In FIG. 8, (a) shows the clock signal 301, (d) shows the ramp wave voltage Vs, (f) shows the threshold voltage Vk, and (g) shows the output rectangular wave with 50% duty ratio.

Figure 9:
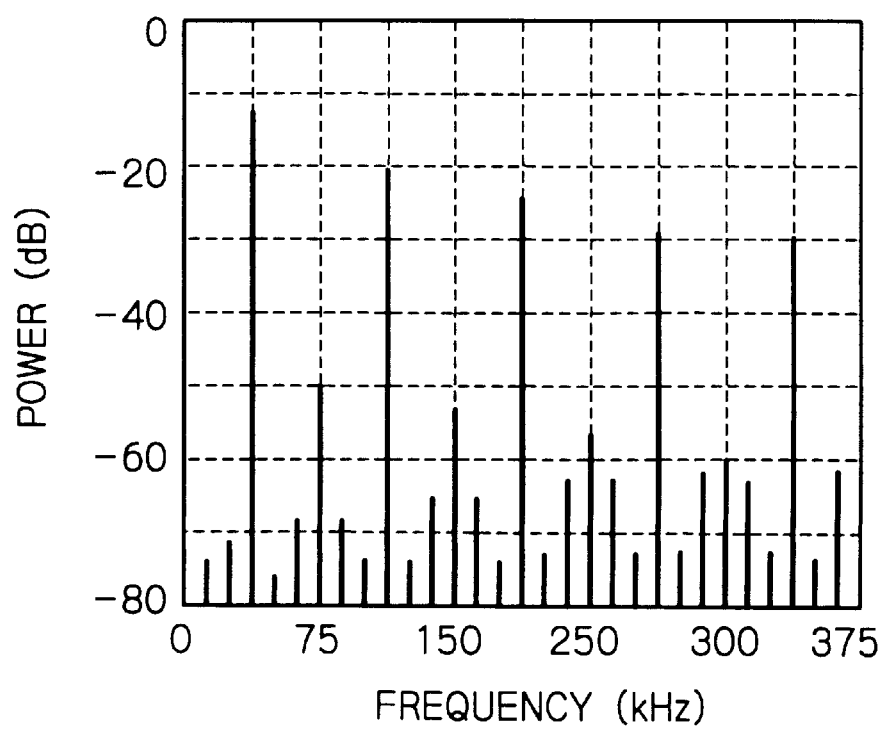
FIG. 9 shows experimental spectrum in an output signal of the frequency synthesizer in FIG. 5.

FIG. 9 shows the experimental frequency spectrum in the embodiment of FIG. 5. It should be noted that only the components of fundamental frequency of 37.5 kHz and the harmonics of the same have high amplitude, but the spurious components are much suppressed. The maximum level of the spurious components is only −50 dBc.

(Second Embodiment of a Frequency Synthesizer)

Figure 10:
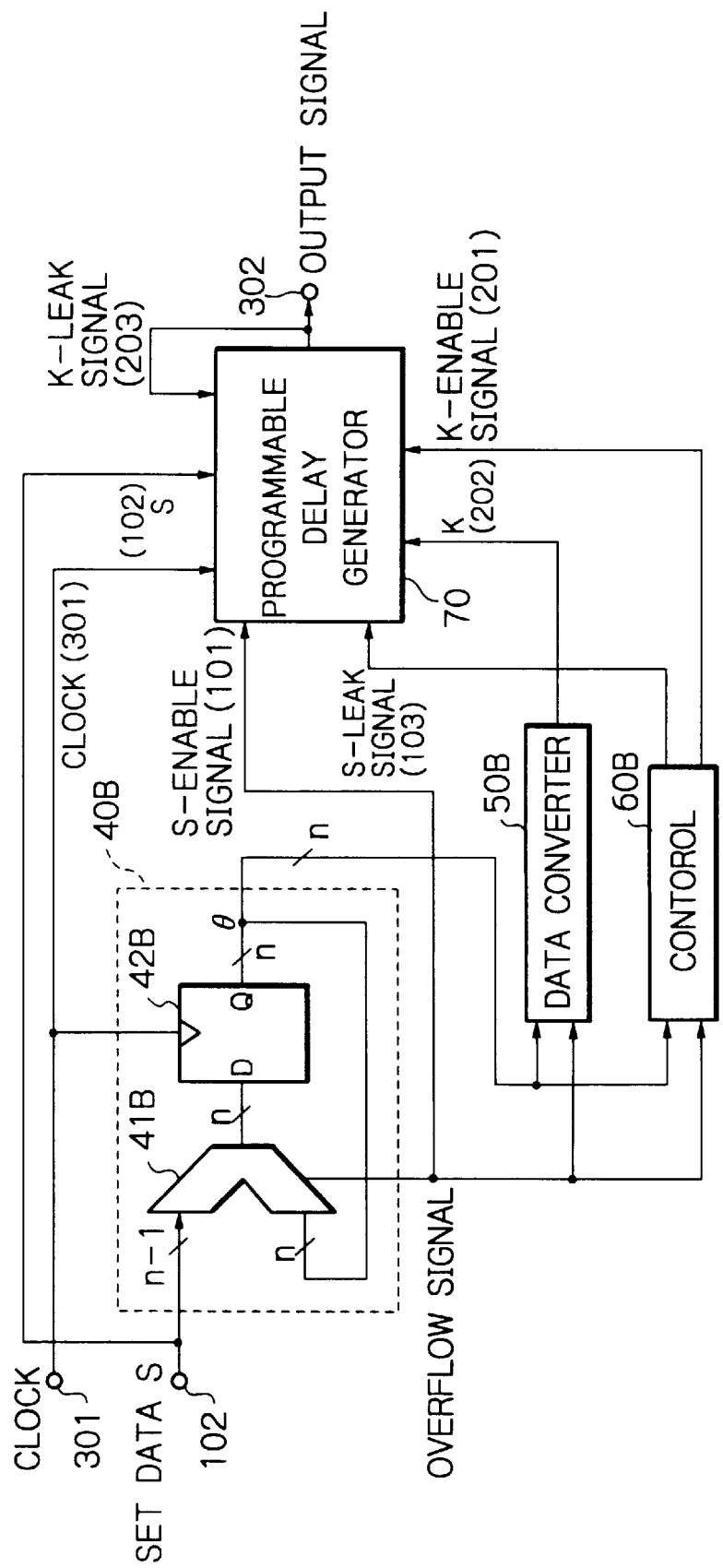
FIG. 10 is a block diagram of a second embodiment of a frequency synthesizer according to the present invention.

FIG. 10 shows a block diagram of a second embodiment of a frequency synthesizer according to the present invention. In the figure, the frequency synthesizer has an accumulator 40B, a data converter 50B, a control circuit 60B, and a programmable delay generator 70. The accumulator 40B has an adder 41B and a latch circuit 42B. The set data S at a set data input terminal 102 is applied to an adder 41B of the accumulator 40B, and a programmable delay generator 70. A clock signal at a clock input terminal 301 is applied to a latch circuit 42B of the accumulator 42B, and the programmable delay generator 70.

An output data θ of the accumulator 40B is applied to the data converter 50B and the control circuit 60B. An overflow bit at an output of the adder 41B of the accumulator 40B is applied to the data converter 50B, the control circuit 60B, and the programmable delay generator 70 as an S-enable signal 101. The overflow signal is delayed by $\Delta_t$ as shown below.

$$\Delta_t = ((2^n - \theta)/S)T \quad (17)$$

The data converter S0B calculates the numerator $(2^n - \theta)$ of the equation (17), and provides the set data K of the programmable delay generator 70. The control circuit 60B provides an S-leak signal 103 which is 1 clock delay of inversion of an overflow bit, and a K-enable signal 201 which rises earlier than the rise of an overflow bit by 1 clock period with pulse width equal to 1 clock period. An output of the programmable delay generator 70 is an output signal 302, which is feedback to the programmable delay generator 70 itself as a K-leak signal 203.

In the above structure, the programmable delay generator 70 provides delay time defined by the equation (17), and the frequency synthesizer of FIG. 10 provides spurious free rectangular signal with fundamental frequency defined by the equation (15). If a toggle flip-flop (T-FF) is attached to an output 302, an output signal has 50% duty ratio, with fundamental frequency equal to half of that defined by the equation (15).

(Third Embodiment of a Frequency Synthesizer)

Figure 11:
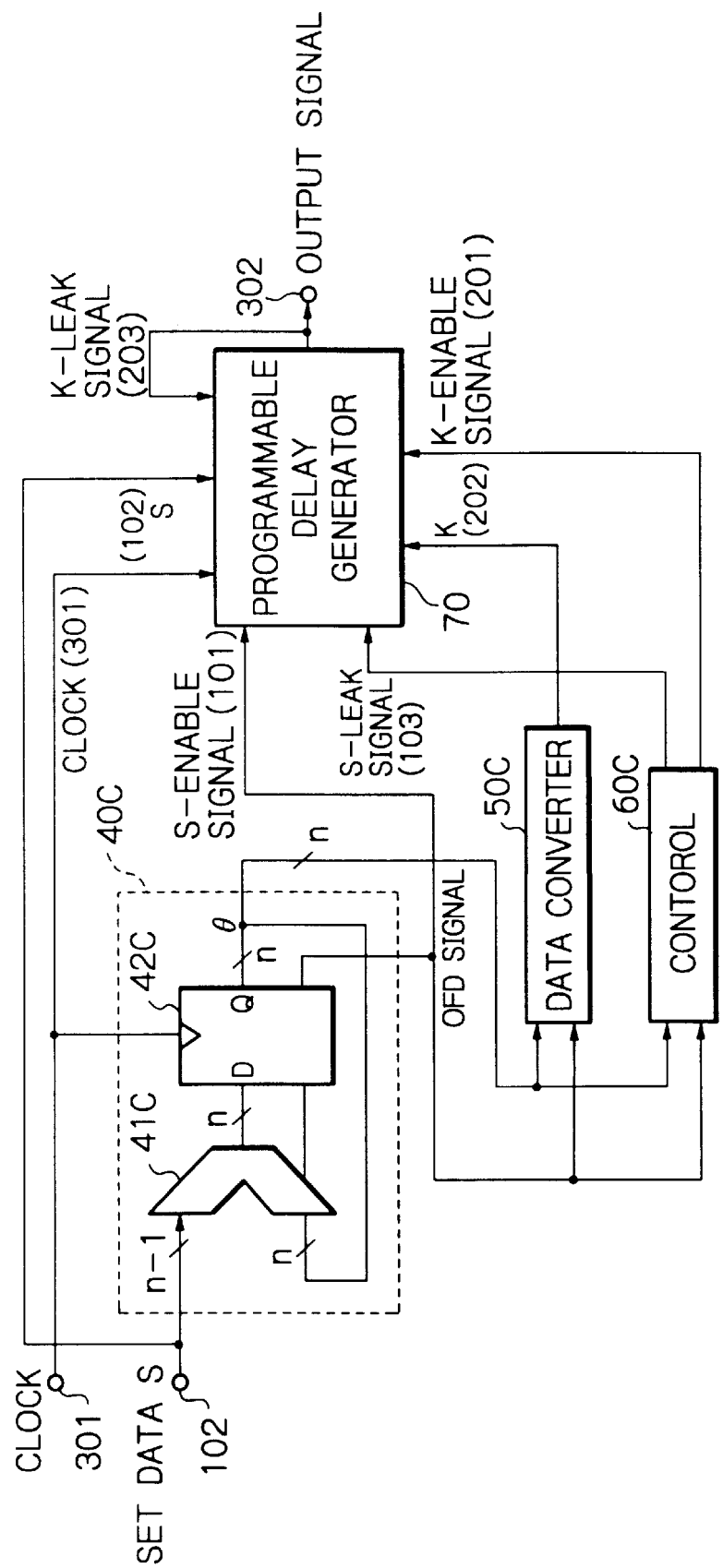
FIG. 11 is a block diagram of a third embodiment of a frequency synthesizer according to the present invention.

FIG. 11 shows a block diagram of still another embodiment of a frequency synthesizer according to the present invention.

In the figure, the frequency synthesizer has an accumulator 40C, a data converter 50C, a control circuit 60C, and a programmable delay generator 70. The accumulator 40C has an adder 41C and a latch circuit 42C. A set data S at a set data input terminal 102 is applied to an adder 41C of the accumulator 40C, and the programmable delay generator 70. A clock signal at a clock signal input terminal 301 is applied to a latch circuit 42C of the accumulator 40C, and the programmable delay generator 70.

An output θ of the accumulator 40C is applied to the data converter 50C and the control circuit 60C. An overflow bit of the adder 41C of the accumulator 40C is delayed by 1 clock period by the latch circuit 42C, and the delayed signal is called OFD signal. The OFD signal is applied to the data converter 50C, the control circuit 60C, and the programmable delay generator 70 as an S-enable signal 101. The OFD signal is delayed by;

$$\Delta_t = ((S - \theta)/S)T \quad (18)$$

The data converter calculates the numerator of the equation (18), and provides a set data K (202) which is applied to the programmable delay generator 70. The control circuit 60C provides an S-leak signal 103, which is delayed signal by 1 clock period of inversion of the OFD signal, and a K-enable signal 201, which rises earlier than the rise of the OFD signal and has the pulse width equal to 1 clock period. An output of the programmable delay generator 70 is an output signal 302, and is fedback to the programmable delay generator 70 itself as a K-leak signal 203.

The programmable delay generator 70 provides delay time defined by the equation (18), and the frequency synthesizer of FIG. 11 provides spurious free rectangular signal having fundamental frequency defined by the equation (15). If a toggle flip-flop (T-FF) is added to an output terminal of the programmable delay generator, output signal has 50% duty ratio, with half fundamental frequency defined by the equation (15).

(First Embodiment of a Frequency Multiplier)

Figure 14A:
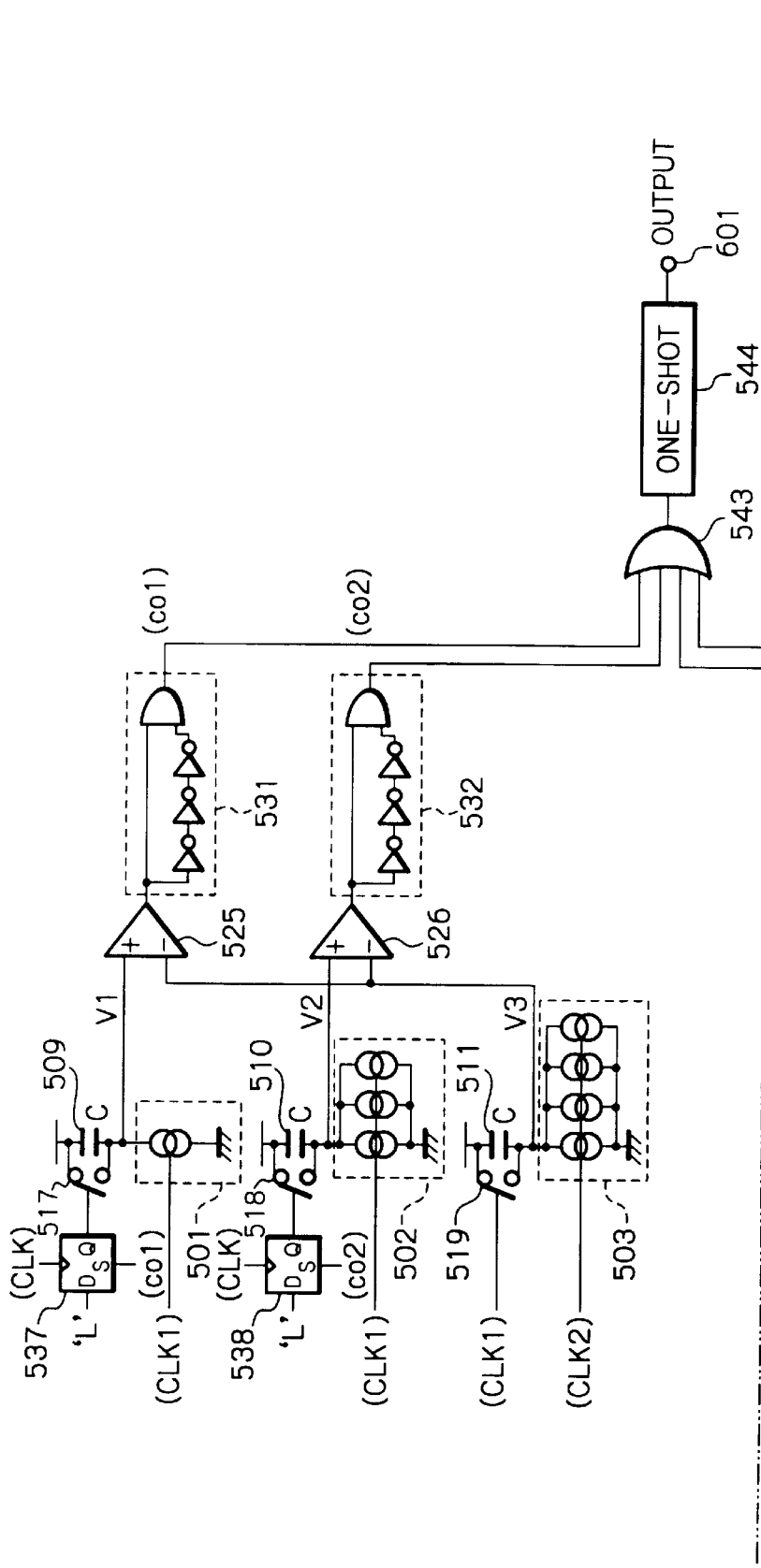
FIG. 14 is a block diagram of a first embodiment of a frequency multiplier according to the present invention.
Figure 14B:
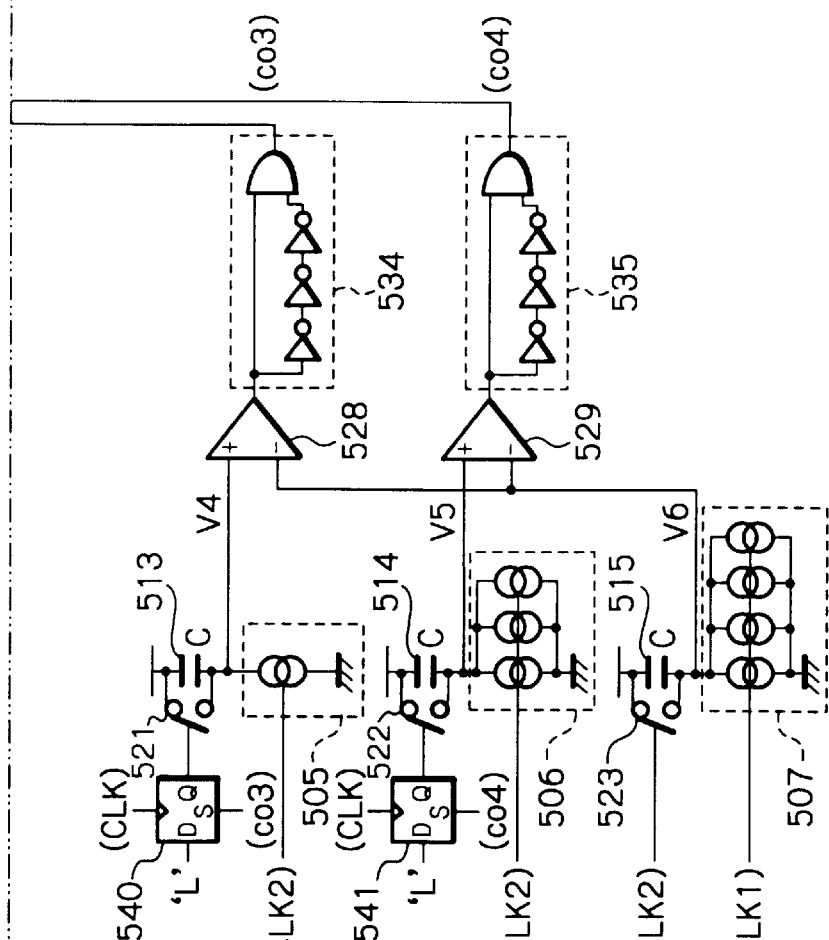

FIG. 14 shows a block diagram of a first embodiment of a frequency multiplier using the present programmable delay generator. In the figure, the numeral 500 is a distributor, 501–503 and 505–507 are a current switch (current source) which flows in/out current controlled on/off by an external circuit, 509–511 and 513–515 are a capacitor, 517–519 and 521–523 are a switch, 525, 526, 528 and 529 are a comparator, 531, 532, 534 and 535 are a pulse width adjustment circuit, 537, 538, 540 and 541 are a D-FF, 543 is an OR gate, 544 is a one-shot multivibrator, 600 is an input terminal of a signal which is subject to frequency multiplication, and 601 is an output terminal.

FIG. 14 includes four delay generators. A first delay generator and a third delay generator provide delay time of (1/4)T, and a second delay generator and a fourth delay generator provide delay time of (3/4)T, where T is period of an input signal to be multiplied.

The threshold voltage V1 of the first delay generator is provided by the current switch 501, the capacitor 509 and the switch 517. The ramp wave voltage V3 of the first delay generator is provided by the current switch 503, the capacitor 511 and the switch 519. The voltages V1 and V3 are compared by the comparator 525, which provides an output of the first delay generator. The pulse width adjustment circuit 531 shapes an output of the first delay generator to provide a narrow output pulse, so that an output pulse of the first delay generator does not overlap with outputs of other delay generators on time axis.

The threshold voltage V2 of the second delay generator is provided by the current switch 502, the capacitor 510, and the switch 518, and the ramp wave voltage V3 of the second delay generator is provided by the current switch 503, the capacitor 511 and the switch 519. The ramp wave voltage V3 functions as a ramp voltage of both the first delay generator and the second delay generator.

The threshold voltage V4 of the third threshold voltage is provided by the current switch 505, the capacitor 513 and the switch 521. The ramp wave voltage V6 of the third delay generator is provided by the current switch 507, the capacitor 515 and the switch 523.

The threshold voltage V5 of the fourth delay generator is provided by the current switch 506, the capacitor 514 and the switch 522, and the ramp wave voltage V6 of the fourth delay generator is provided by the current switch 507, the capacitor 515 and the switch 523. The voltage V6 functions as a ramp voltage of both the third delay generator and the fourth delay generator.

FIG. 15 shows operational time charts of a frequency multiplier of FIG. 14. The curve (a) shows a signal CLK to be multiplied, the curve (b) shows an output CLK1 of the distributor 500, the curve (c) shows an inverted output CLK2 of the distributor 500, the curve (d) shows the threshold voltage V1 of the first delay generator, the threshold voltage V2 of the second delay generator, and the ramp wave voltage V3 of the first delay generator (and the second delay generator), the curve (e) shows the threshold voltage V4 of the third delay generator, the threshold voltage of the fourth delay generator, and the ramp wave voltage V6 of the third delay generator (and the fourth delay generator). and the curve (f) shows an output signal of the frequency multiplier.

The disbributor 500 is implemented by a T-FF, which inverts an output signal upon receipt of an input pulse CLK to an input signal which is to be multiplied, and provides a pair of complemental outputs (CLK1 in (b), and CLK2 in (c)). When the signal CLK1 is high, the current switches 501 and 502 turn ON, and the capacitors 509 and 510 are charged proportional to time. When the period T of the input signal is elapsed, the signal CLK1 turns to low, and the current switches 501 and 502 turns OFF. The capacitors 509 and 510 keep the charge, provided that input impedance of the comparators 525 and 526 is sufficiently high. If the current switches 501 and 502 are designed so that the ratio of the current by those switches is 1:3, by an external set data, or hardware structure of those current switches, the ratio of the voltages V1 and V2 of the capacitors 509 and 510, respectively, is just 1:3.

On the other hand, when the signal CLK1 is high, the switch 519 is in ON state, and the capacitor 511 discharges. When the signal CLK1 returns low, and the signal CLK2 becomes high, the current switch 503 turns ON, and the capacitor 511 is charged proportional to time. If the current source of the current switch 503 is designed four times as large as that of the current switch 501, by hardware structure or an external set data. Assuming that the current source of the current switch 503 is four times as large as that of the current switch 501 by an external set data or hardware structure, then, the voltage V3 of the capacitor 511 coincides with V1 after (1/4)T of the rise of the signal CLK2, and coincides with V2 after (3/4)T of the rise of the signal CLK2. The comparator 525 detects the timing of (1/4)T, and provides an output signal of the first delay generator, and the comparator 526 detects the timing of (3/4)T, and provides an output signal of the second delay generator. Outputs co1 and co2 of the pulse width adjustment circuits 531 and 532 are applied to the set inputs of D-FF 537, and 538, respectively, so that those flip-flops turn ON. Thus, the switches 517 and 518 turn ON, and the capacitors 509 and 510 discharges for the next operation.

The operation of the third delay generator and the fourth delay generator is the same as that of the first delay generator and the second delay generator, except that the operation is offset by T. Thus, the pulse width adjustment circuit 532 provides an output pulse after (1/2)T of an output pulse of the pulse width adjustment circuit 531, and the pulse width adjustment circuit 534 provides an output pulse after (1/2)T of an output pulse of the pulse width adjustment circuit 532. Further, after (1/2)T of the output pulse of the pulse width adjustment circuit 534, the pulse width adjustment circuit 535 provides an output pulse. As a result, the circuit of FIG. 14 provides a rectangular output pulse 601 having the period (1/2)T and pulse width defined by a one-shot multivibrator 544.

As described above, the circuit of FIG. 14 having a delay generator provides output pulses having shorter period than that of an input signal. Thus, a multiplied output signal which is spurious free is obtained with no adjustment of a circuit constant. As the present delay generator is used in a frequency multiplier, it has the advantage that spurious characteristics are not deteriorated in spite of error of a circuit constant, and/or variation of power supply voltage.

In the embodiment of FIG. 14, the delay time is (1/4)T and (3/4)T, other delay time for providing double frequency is of course possible. For instance, the combination of 0 and (1/2)T, or (1/2)T and (2/2)T are possible with simple hardware structure. Considering spurious characteristics of a multiplied output signal, the combination of (1/4)T and (3/4) is the best.

(Second Embodiment of a Frequency Multiplier)

Figure 16B:
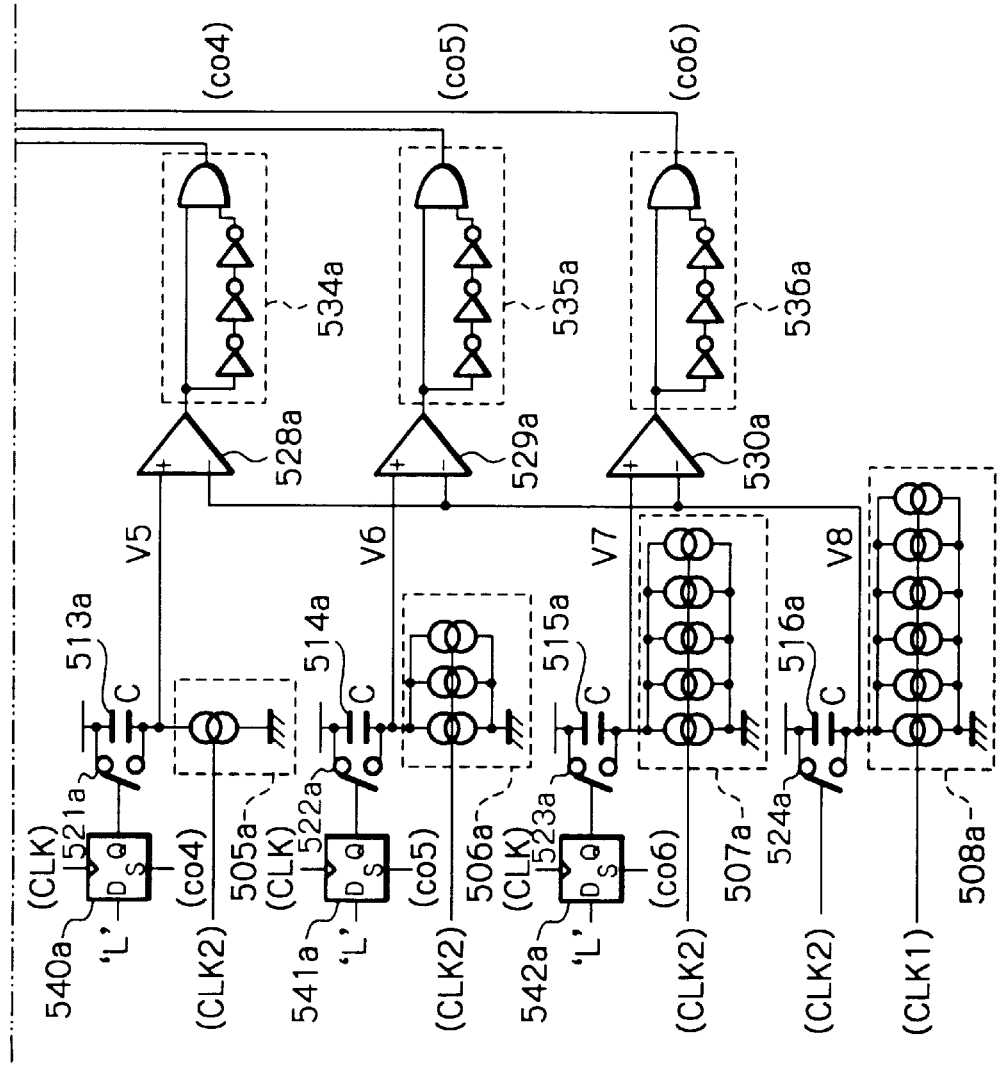
FIG. 16 is a block diagram of a second embodiment of a frequency multiplier according to the present invention.

FIG. 16 is a block diagram of second embodiment of the present frequency multiplier. In the figure, the numeral 500a is a distributor, 501a–508a are a current switch which flows in or out current defined by set data or hardware structure, 509a–516a are a capacitor, 517a–524a are a switch, 525a–530a are a comparator, 531a–536a are a pulse width adjustment circuit, 537a–542a are a D-FF, 543a is an OR gate, 544a is a oneshot multivibrator, 600a is an input terminal of frequency to be multiplied, and 601a is an output terminal of multiplied signal.

FIG. 16 has six delay generators. A first and a fourth delay generators provide delay of (1/6)T, where T is period of an input signal to be multiplied. A second and fifth delay generators provide delay of (3/6)T, and a third and a sixth delay generators provide delay of (5/6)T.

The operation of FIG. 16 is similar to that of FIG. 14, except a number of delay generators, and delay time of each delay generators. The threshold voltage V1 of the first delay generator is provided by a current switch 501a, a capacitor 509a and a switch 517a, and the ramp wave voltage V4 of the first delay generator is provided by a current switch 504a, a capacitor 512a and a switch 520a. A comparator 526a which compares V1 and V4 provides an output of the first delay generator. The pulse width adjustment circuit 531a shapes an output of the first delay generator so that it is narrow, so that an output of the first delay generator does not overlap with an output of other delay generators.

FIG. 17 shows operational time charts of the circuit of FIG. 16. The curve (a) is an input signal which is subject to multiply, the curve (b) is an output CLK1 of the distributor 500a, the curve (c) shows an output CLK2 of the distributor 500a. CLK1 is opposite to CLK2. The curve (d) shows the threshold voltages V1, V2, V3 of the first, the second, and the third delay generators, respectively, and the ramp wave voltage V4 of the first, the second and the third delay generators, the curve (e) shows the threshold voltages V5, V6 and V7 of the fourth, the fifth, and the sixth delay generators, respectively, and the ramp wave voltage V8 of the fourth, the fifth and the sixth delay generators. The curve (f) shows a multiplied output signal.

When an output signal CLK1 of the distributor 500a turns high, the current switches 501a, 502a and 503a turn ON, and the capacitors 509a, 510a and 511a are charged proportional to time. When time T which is period of an input signal to be multiplied elapses, the signal CLK1 turns low, and the current switches 501a, 502a and 503a returns OFF. The capacitors 509a, 510a and 511a keep the charge, provided an input impedance of the comparators 525a, 526a and 527a is sufficiently high. Assuming that the ratio of the current sources of the current switches 501a, 502a and 503a is designed to be 1:3:5, the ratio of the voltages V1, V2 and V3 is just 1:3:5.

On the other hand, when the signal CLK1 is high, the switch 520a is in ON state, and the capacitor 512a is discharged. When the signal CLK1 turns low and the signal CLK2 turns high, the current switch 504a turns ON, and the capacitor 512a is charged proportional to time. It is supposed that the current source of the current switch 504a is six times as large as that of the current switch 501a. Then, the voltage V4 of the capacitor 512a coincides with V1 after (1/6)T of the rise of CLK1, V2 after (3/6)T, and V3 after (5/6)T. The comparator 525a detects the timing of (1/6)T and provides an output of the first delay generator, the comparator 526a detects the timing of (3/6)T and provide an output of the second delay generator, and the comparator 527a detects the timing of (5/6)T and provide an output of the third delay generator. The outputs co1, co2 and co3 of the pulse width adjustment circuits 531a, 532a and 533a, respectively, are applied to the set inputs of the D-FF 537a, 538a, and 539a, respectively, to turn ON those filp-flops. Thus, the switches 517a, 518a and 519a turn ON, and the capacitors 509a, 510a and 511a discharge for the next cycle of operation.

The operation of the fourth through the sixth delay generators is the same as that of the above first through third delay generators, except that the former operates with the offset by T. Therefore, the pulse width adjustment circuits 531a through 536a provide output pulses in every (1/3)T. As a result, the multiplier of FIG. 16 provides a rectangular output 601a having the period (1/3)T, and the pulse width defined by the one-shot multvibrator 544a.

The circuit of FIG. 16 which uses the present delay generator provides a spurious free output pulse having shorter period than that of input signal, with no adjustment of a circuit constant. The use of a programmable delay generator of the present invention in a delay generator has the advantage that the spurious characteristics do not deteriorate in spite of error of circuit constants, and variation of power supply voltage.

Although delay times in the embodiment of FIG. 16 are (1/6)T, (3/6)T and (5/6)T, other delay times are possible to provide triple frequency multiplier, for instance the combination of 0, (1/3)T and (2/3)T, or (1/3)T, (2/3)T and (3/3)T. Those combinations are easily implemented by a hardware. Considering spurious characteristics and size of a circuit, the combination of (1/6)T, (3/6)T and (56)T is the best.

(Third Embodiment of a Frequency Multiplier)

Figure 18B:
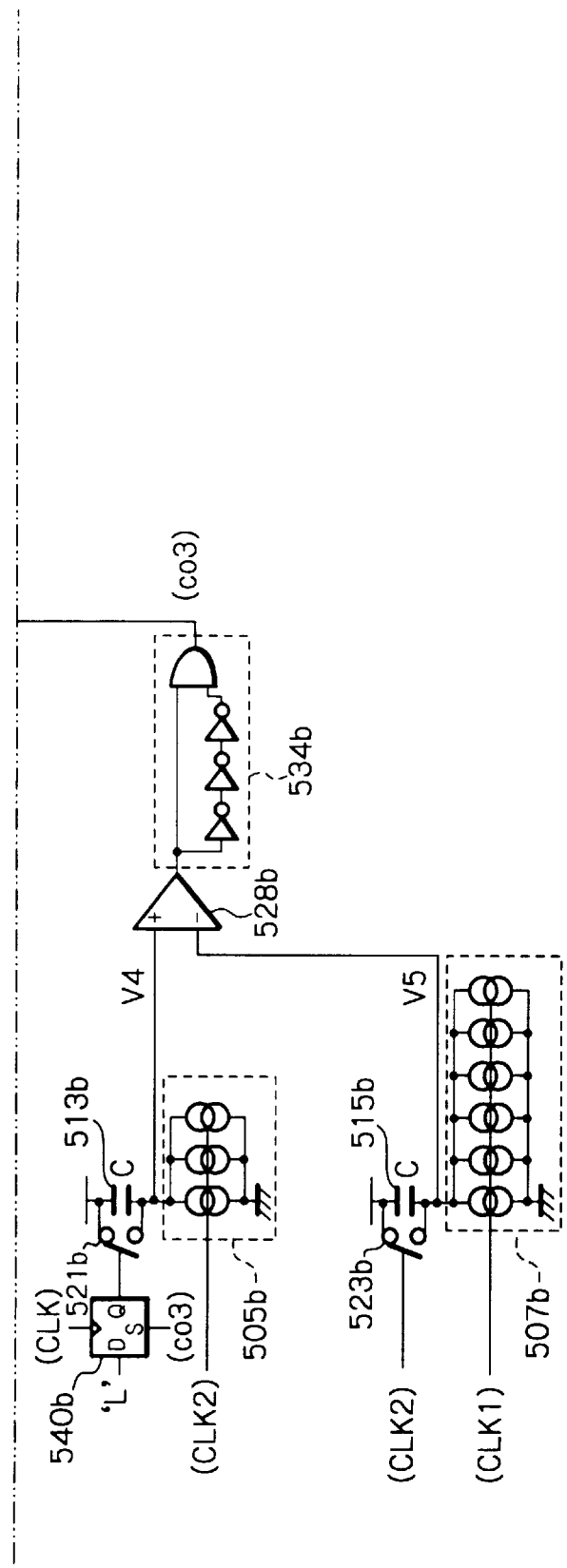
FIG. 18 is a block diagram of a third embodiment of a frequency multiplier according to the present invention.

FIG. 18 is a block diagram of another embodiment of a frequency multiplier according to the present invention.

In the figure, 500b is a disbributor, 501b–503b, 505b, and 507b are a current switch for flow in or out current defined by a set data or hardware design, and switched ON/OFF by an external signal, 509b–511b, 513b and 515b are a capacitor, 517b–519b, 521b, 523b are a switch, 525b–526b and 528b are a comparator, 531b–532b and 534b are a pulse width adjustment circuit, 537b–538b and 540b are a D-FF, 543b is an OR gate, 544b is a one-shot multivibrator, 600b is an input terminal of a signal to be multiplied, and 601b is an output terminal of multiplied signal.

The circuit of FIG. 18 includes three delay generators. The first delay generator provides delay of (1/6)T, the second delay generator provides delay of (5/6)T, and the third delay generator provides delay of (9/6)T, where T is period of an input signal.

The operation principle of FIG. 18 is essentially the same as that of FIGS. 14 and 16, except a number of delay generators. The first threshold voltage V1 of the first delay generator is provided by a current switch 501b, a capacitor 509b, and a switch 517b, and the ramp wave voltage V3 of the first delay generator is provided by a current switch 503b, a capacitor 511b, and a switch 519b. A comparator 525b which compares V1 with V3 provides an output of the first delay generator. A pulse width adjustment circuit 531b shapes an output pulse of the first delay generator so that it is narrow, so that an output pulse of the first delay generator does not overlap with an output of the second and the third delay generators.

FIG. 19 shows operational time charts of a frequency multiplier of FIG. 18. The curve (a) shows an input signal CLK which is to be multiplied. The curve (b) shows an output CLK1 of the distributor 500b, and the curve (c) shows an output CLK2 of the distributor 500b. CLK1 is opposite to CLK2. The curve (d) shows the threshold voltage V1 of the first delay generator, the threshold voltage V2 of the second delay generator, and the ramp wave voltage V3 of the first and the second delay generators. The curve (e) shows the threshold voltage V4 of the third delay generator, and the ramp wave voltage V5 of the third delay generator. The curve (f) shows an output signal of the frequency multiplier.

When an output CLK of the distributor 500b turns high, the current switches 501b and 502b turn ON, and the capacitors 509b and 510b are charged proportional to time. When the time T which is period of an input signal elapses, the signal CLK turns low, and the current switches 501b and 502b turn OFF. The capacitors 509b and 510b keep the charge provided that an input impedance of the comparators 525b and 526b are sufficiently high. Assuming that the ratio of the current sources of the current switches 501b and 502b is 1:5, the ratio of the voltages across the capacitors 509b and 510b is just 1:5.

On the other hand, when the signal CLK1 is high, the switch 519b is in ON state, and the capacitor 511b is discharged. When the signal CLK1 returns low and the signal CLK2 returns to high, the current switch 503b becomes ON, and the capacitor 511b charges proportional to time. It is assumed that the current source of the current switch 503b is six times as large as that of the current switch 501b. Then, the voltage V3 across the capacitor 511b coincides with V1 after (1/6)T of the rise of CLK2, and coincides with V2 after (5/6)T of the rise of CLK2. The comparator 525b provides an output of the first delay generator at the timing of (1/6)T, and the comparator 526b provides an output of the second delay generator at the timing of (5/6)T. The outputs co1 and co2 of the pulse width adjustment circuits 531b and 532b are applied to the set inputs of D-FF 537b and 538b, which are caused to turn ON. Thus, the switches 517b and 518b turn ON, and the capacitors 509b and 510b are discharged for the next operation.

The third delay generator operates similarly, and provides an output pulse after (3/6)T of the rise of CLK1. That timing corresponds to (9/6)T from the rise of CLK2. Therefore, the pulse width adjustment circuits 531b–532b and 534b provide an output pulse in every (4/6)T. As a result, a frequency multiplier of FIG. 18 provides a rectangular output pulse having the period (4/6)T and the pulse width defined by the one-shot multivibrator 544b.

The embodiment of FIG. 18 which uses the present delay generator, generates pulses having shorter period than that of an input signal, and provides a spurious free output signal with no adjustment of circuit constants. The use of the present delay generator in a frequency multiplier has the advantage that the spurious characteristics are not deteriorated in spite of error of circuit constants, and variation of power supply voltage.

Although delays in the embodiment of FIG. 18 are (1/6)T, (5/6)T and (9/6)T, other combination of delays to provide 3/2 frequency multiplier is possible. For instance, the combination of 0, (4/6)T and (8/6)T, or (2/6)T, (6/6)T and (10/6)T are possible. Considering spurious characteristics and size of a circuit, the combination of (1/6)T, (5/6)T and (9/6)T is the best.

(First Embodiment of a Duty Ratio Converter)

Figure 20:
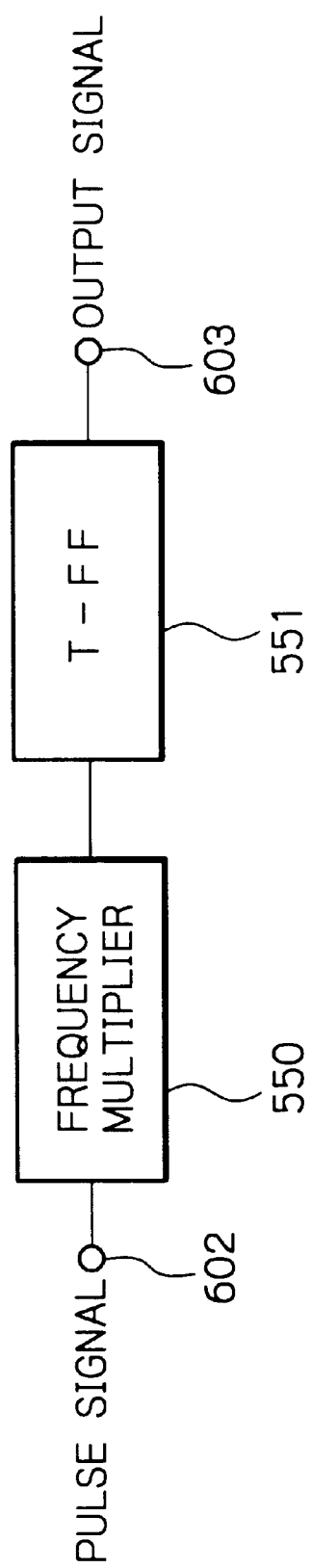
FIG. 20 is a block diagram of a first embodiment of a duty ratio converter according to the present invention.

FIG. 20 is a block diagram of a first embodiment of a duty ratio converter using a programmable delay generator according to the present invention. In the figure, the numeral 550 is a frequency multiplier (doubler) according to the present invention, 551 is a T-FF (toggle flip-flop), 602 is an input terminal, and 603 is an output terminal.

Figure 21:
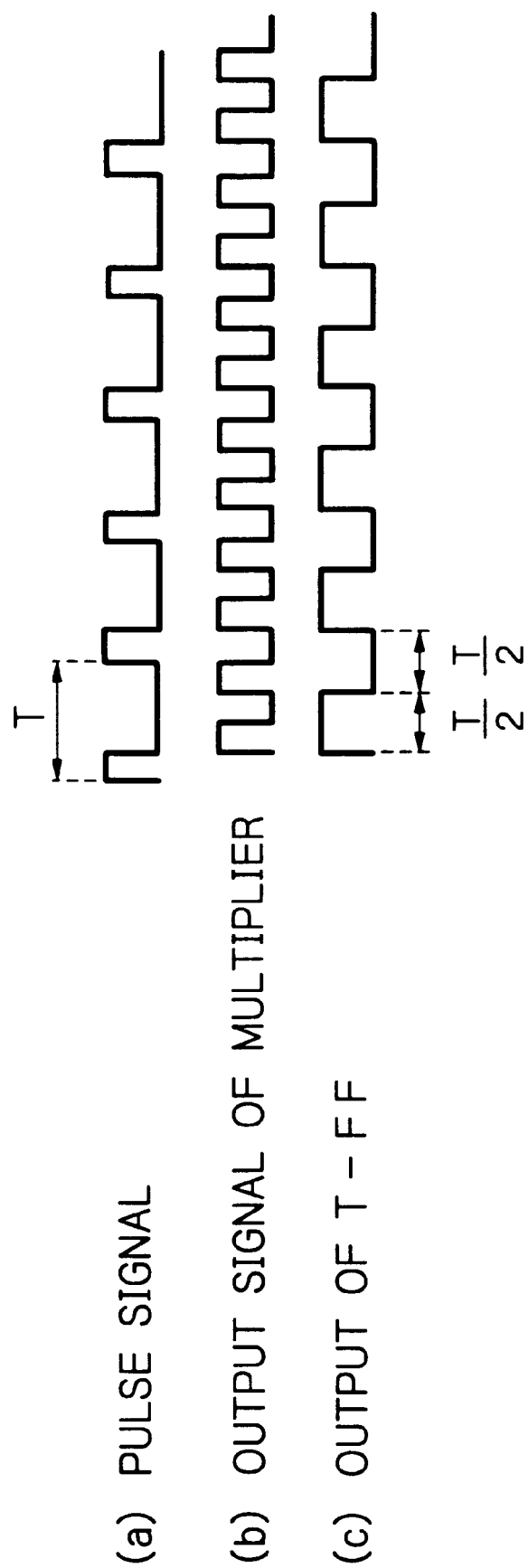
FIG. 21 shows operational time charts of the duty ratio converter in FIG. 20.

FIG. 21 shows operational time charts of the apparatus of FIG. 20. The curve (a) shows a pulse signal, the curve (b) shows an output of a frequency multiplier 550, and the curve (c) shows an output of a T-flip-flop (T-FF) 551. When period of an input pulse (a) is T, an output of the multiplier 550 has the period (1/2)T. The T-flip-flop (T-FF) 551 switches an output of the same to ON and OFF in every input from the multiplier 550. Thus, an output of the T-flip-flop (T-FF) 551 is rectangular signal having duty ratio 50% and the period T.

The embodiment of FIG. 21 including the present frequency multiplier which provides half period of an input signal, converts duty ratio of an input signal to 50% with no circuit adjustment. The use of the present frequency multiplier insures to keep the duty ratio to 50%, in spite of an error of circuit components, and variation of power supply voltage. Further, even when frequency of an input signal changes, an output signal has duty ratio 50% with no circuit adjustment because of the use of the present frequency multiplier.

(Second Embodiment of a Duty Ratio Converter)

Figure 22:
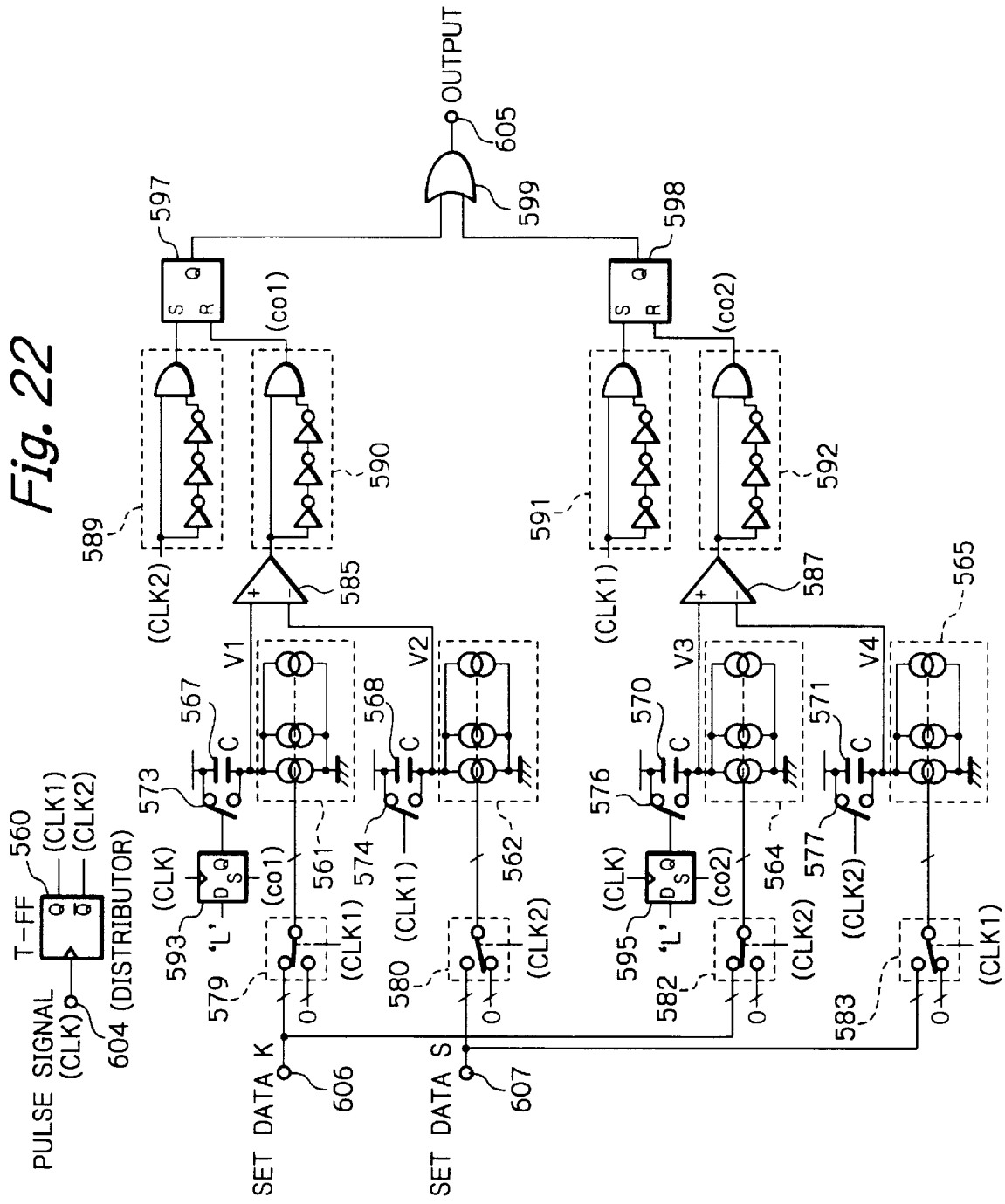
FIG. 22 is a block diagram of a second embodiment of a duty ratio converter according to the present invention.

FIG. 22 is a block diagram of second embodiment of a duty ratio converter according to the present invention. In the figure, the numeral 560 is a distributor, 561, 562, 564 and 565 are a current switch array for flowing in or out current proportional to input data, 567, 568, 570 and 571 are a capacitor, 573, 574, 576 and 577 are a switch, 579, 580, 582 and 583 are a switch which switches digital data having a plurality of bits, 585 and 587 are a comparator, 589–592 are a pulse width converter, 593 and 595 are a D-FF, 597 and 598 are a SR-FF, 599 is an OR gate, 604 is a pulse signal input terminal, 605 is an output terminal, 606 is an input terminal for K set data, and 607 is an input terminal for S set data.

The embodiment of FIG. 22 includes two delay generators. When an input pulse signal has the period T, the first delay generator and the second delay generator provide the delay time of (K/S)T.

The threshold voltage V1 of the first delay generator is provided by a current switch array 561, a capacitor 567 and a switch 573, and the ramp wave voltage V2 of the first delay generator is provided by a current switch array 562, a capacitor 568 and a switch 574.

The threshold voltage V3 of the second delay generator is provided by a current switch array 564, a capacitor 570 and a switch 576, and the ramp wave voltage V4 is provided by a current switch array 565, a capacitor 571 and a switch 577.

FIG. 23 shows operational time charts of a duty ratio converter of FIG. 22. In the figure, the curve (a) shows a pulse signal CLK, the curve (b) shows a first output CLK1 of the distributor 560, the curve (c) shows a second output CLK2 of the distributor 560. CLK2 is an inversion of CLK1. The curve (d) shows the threshold voltage V1 and the ramp wave voltage V2 of the first delay generator, the curve (e) shows the threshold voltage V3 and the ramp wave voltage V4 of the second delay generator, the curve (f) shows an output signal of the duty ratio converter.

The distributor 560 is implemented by a T-FF which inverts outputs CLK1 and CLK2 of the same in every input of a pulse CLK. When CLK1 is high, the current switch array becomes ON, then, the capacitor 567 is charged proportional to the set data K and time. The signal CLK1 returns low when the period T of an input pulse signal elapses, the current switch array 561 turns OFF, and the capacitor 567 keeps the voltage V1. The V1 kept in the capacitor is shown below.

$$V1 = -(KI_0/C)T \quad (19)$$

where $I_0$ is unit current of the current switch array 561.

When V1 is kept, the signal CLK2 turns high, the current switch array 562 turns ON, and the capacitor 568 is charged proportional to the set data S and time. When the signal CLK2 rises to high at time $t_0$, the voltage V2 across the capacitor 568 is expressed as follows.

$$V2 = -(SI_0/C)(t - t_0) \quad (20)$$

Therefore, the delay time $t_d$ of the first delay generator from the time $t_0$ until V1 coincides with V2 is as follows.

$$t_d = (K/S)T \quad (21)$$

The SR-FF (set-reset type flop-flop) 597 is set to high at the rise of the CLK2, and reset to low when V1 coincides with V2. Therefore, the pulse width of the SR-FF 597 is expressed by the equation (21). On the other hand, the second delay generator operates similarly to the first delay generator, but after time T. Both the first delay generator and the second delay generator operate with the period 2T. Therefore, an output of the OR gate 599 is rectangular wave having the period T and the pulse width (K/S)T. Thus, this embodiment provides a rectangular wave having the duty ratio (K/S).

The present duty ratio converter which includes the present programmable delay generator for determining pulse width of an output signal, provides accurate duty ratio with no circuit adjustment. The obtained duty ratio is free from error of circuit constants and/or variation of power supply voltage, because of the use of the present delay generator. Further, even when frequency of an input pulse changes, an output duty ratio is not affected.

(Third Embodiment of a Duty Ratio Converter)

Figure 24A:
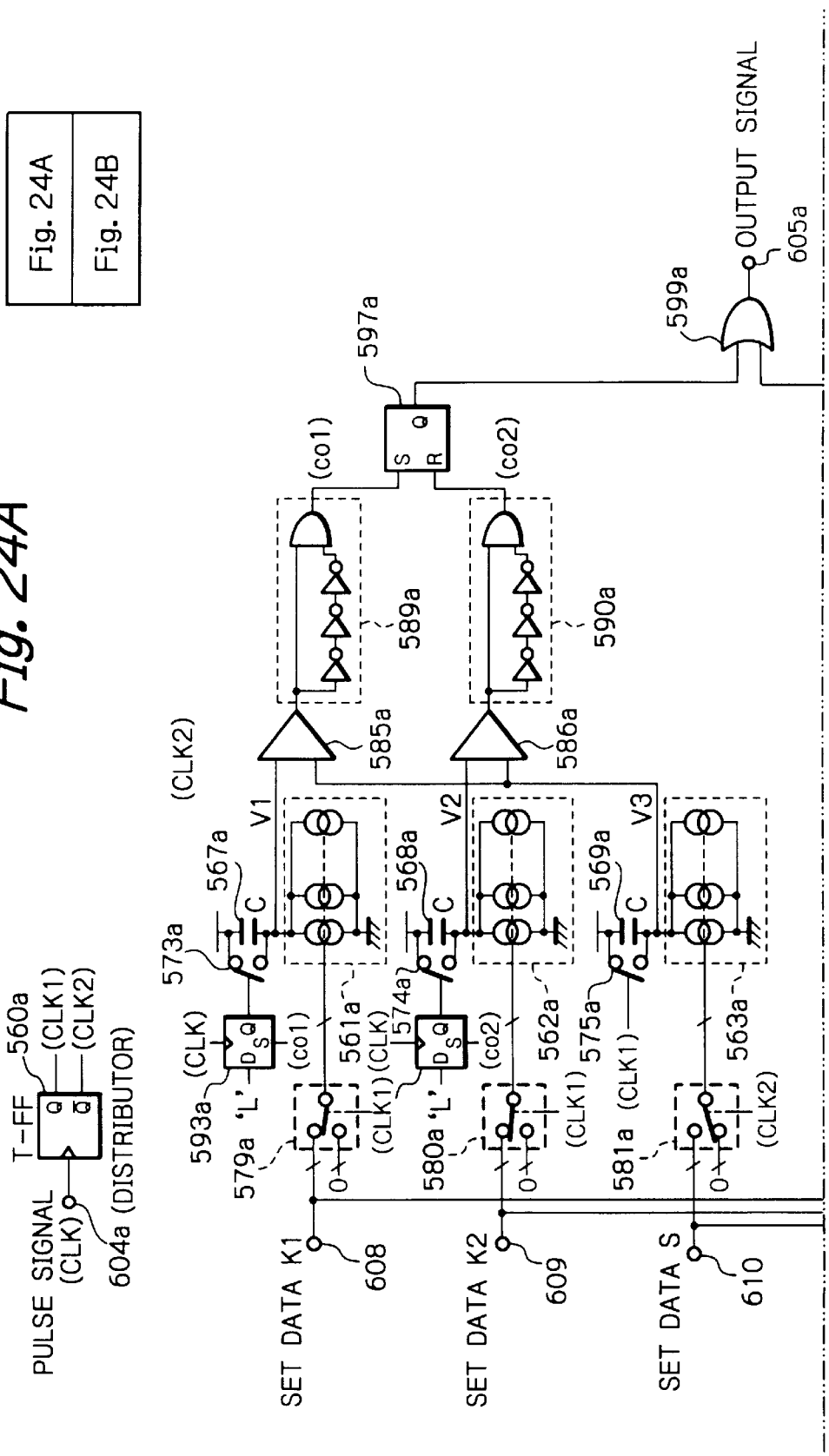
FIG. 24 is a block diagram of a third embodiment of a duty ratio converter according to the present invention.
Figure 24B:
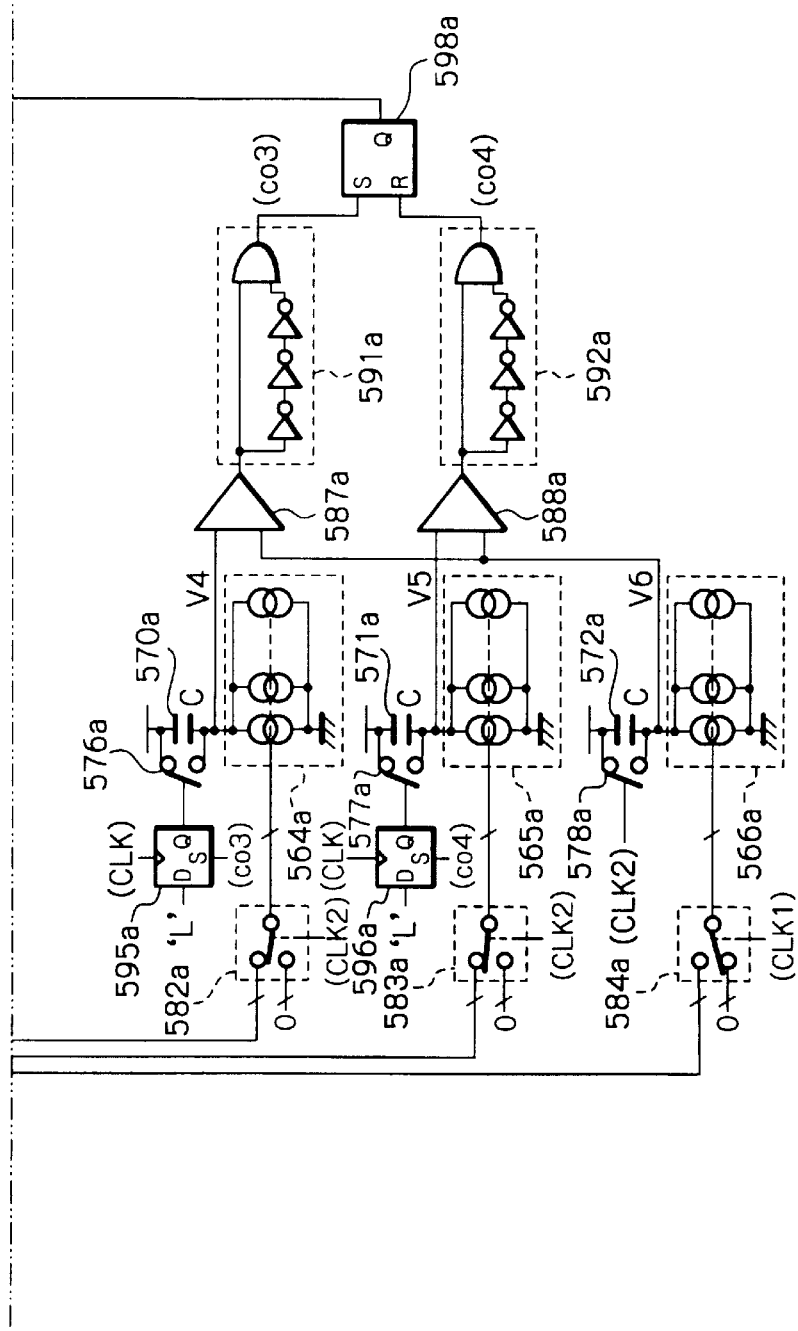

FIG. 24 is a block diagram of the third embodiment of the duty ratio converter according to the present invention. In the figure, the numeral 560a is a distributor, 561a–566a are a current switch array for flowing in or out current proportional to an input data, 567a–572a are a capacitor, 573a–578a are a switch, 579a–584a are a switch for switching digital data which has a plurality of bits, 585a–588a are a comparator, 589a–592a are a pulse width adjustment circuit, 593a–596a are a D-FF, 597a and 598a are a SR-FF, 599a is an OR gate, 604a is a pulse signal input terminal, 605a is an output terminal 608, is an input terminal of a set data K1, 609 is an input terminal of a set data K2, and 610 is an input terminal of a set data S.

The embodiment of FIG. 24 includes four delay generators. When an input pulse signal has the period T, the first and the third delay generators provide the delay time (K1/S)T, and the second and the fourth delay generators provide the delay time (K2/S)T.

The threshold voltage V1 of the first delay generator is provided by a current switch array 561a, a capacitor 567a, and a switch 573a, the threshold voltage V2 of the second delay generator is provided by a current switch array 562a, a capacitor 568a and a switch 574a, the ramp wave voltage V3 of the first and the second delay generators is provided by a current switch array 563a, a capacitor 569a and a switch 575a.

The threshold voltage V4 of the third delay generator is provided by a current switch array 564a, a capacitor 570a and a switch 576a, the threshold voltage V5 of the fourth delay generator is provided by a current switch array 565a, a capacitor 571a and a switch 577a, and the ramp wave voltage V6 of the third and the fourth delay generators is provided by a current switch array 566a, a capacitor 572a and a switch 578a.

FIG. 25 shows operational time charts of the duty ratio converter of FIG. 24. The curve (a) shows a pulse signal CLK, the curve (b) shows a first output CLK1 of the distributor 560a and the curve (c) shows a second output CLK2 of the distributor 560a. CLK2 is inversion of CLK1. The curve (d) shows the threshold voltage V1 of the first delay generator, the threshold voltage V2 of the second delay generator, and the ramp wave voltage V3 of the first and the second delay generators. The curve (e) shows the threshold voltage V4 of the third delay generator, the threshold voltage V5 of the fourth delay generator and the ramp wave voltage V6 of the third and the fourth delay generators. The curve (f) shows an output of the present duty ratio converter.

The duty ratio converter of FIG. 24 determines both the rise and the fall of an output pulse by separate delay generators, while the previous embodiment of FIG. 22 determines only the fall of an output pulse by a delay generator. The timing of the rise of an output pulse in FIG. 24 is determined by the first and the third delay generators, and the timing of the fall of an output pulse is determined by the second and the fourth delay generators.

The delay time $t_d1$ of the first and the third delay generators is expressed as follows, by using set data K1 and S.

$$t_d1=(K1/S)T \quad (22)$$

The delay time $t_d2$ of the second and the fourth delay generators is expressed as follows, by using set data K2 and S.

$$t_d2=(K2/S)T \quad (23)$$

The SR-FF 597a is set by an output pulse of the first delay generator, and is reset by an output pulse of the second delay generator. Therefore, the pulse width of an output pulse of the SR-FF 597a is ((K2−K1)/S)T. The third and the fourth delay generators operate similar to that of the first and the second delay generators, but after the period T. Thus, all the delay generators operate with the period 2T. Therefore, an output of the OR gate 599a is a rectangular wave having the period T and the pulse width ((K2−5K1)/S)T. Therefore, an output pulse having the duty ratio ((K2−K1)/S) is obtained.

The present duty ratio converter which uses the present delay generator for determining pulse width of an output pulse, provides accurate duty ratio with no circuit adjustment. The use of the present delay generator has the advantage that no error of duty ratio of an output signal occurs in spite of error of circuit constants and/or variation of power supply voltage. Further, because of the use of the present delay generator, desired duty ratio is always obtained even when input frequency changes with no circuit adjustment. Further, the phase of an output signal may be designed arbitrary, since both the rise and the fall of an output signal are controlled.

(PLL Frequency Synthesizer)

Figure 26:
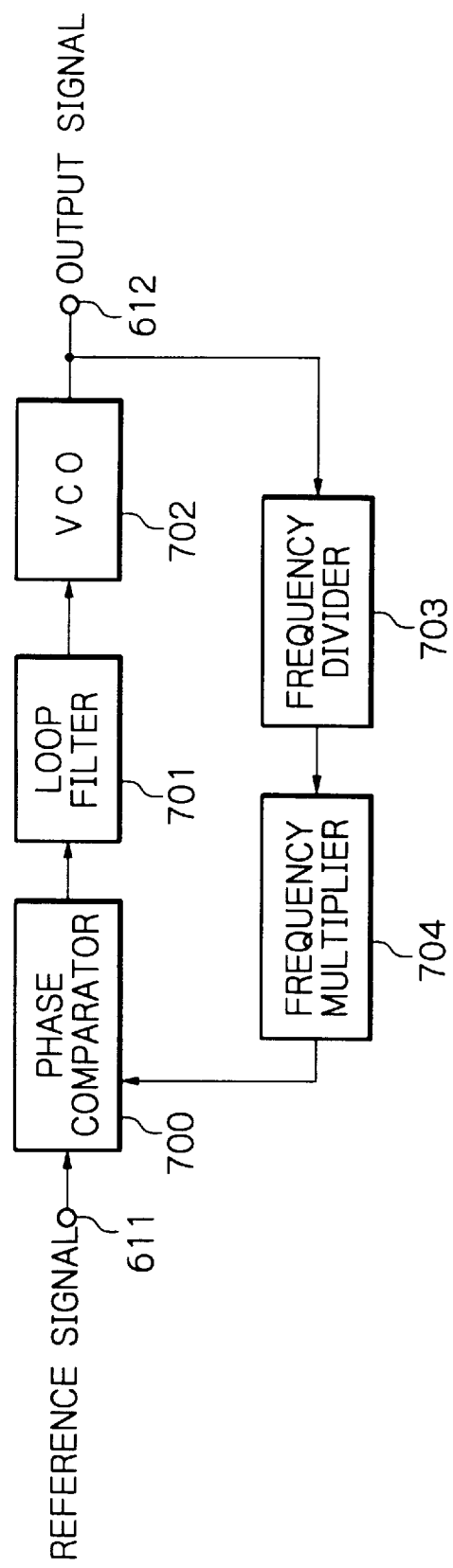
FIG. 26 is a block diagram of a PLL frequency synthesizer according to the present invention.

FIG. 26 is a block diagram of a PLL frequency synthesizer using the present delay generator. In the figure, the numeral 611 is an input terminal of a reference signal, 612 is an output terminal, 700 is a phase comparator, 701 is a loop filter, 702 is a VCO (voltage controlled oscillator), 703 is a frequency divider having divide ratio N, and 704 is a frequency multiplier having multiply ratio n/m.

The feature of FIG. 26 is the presence of the frequency multiplier 704 between a frequency divider and a phase comparator in a conventional PLL frequency synthesizer.

Conventionally, a mixer or a pulse train generator has been inserted between a frequency divider and a phase comparator for frequency conversion. A pulse train generator is described in T. Nakagawa and T. Ohira, "A phase noise reduction technique for MMIC frequency synthesizers that uses a new pulse generator LSI", IEEE Trans. Microwave Theory Tech., vol. 42, no. 12, pp. 2579–2582, December 1994. It has the advantage that frequency step is small, while keeping reference frequency high, and phase noise low. However, it has the disadvantage that it would generate spurious when an integer multiple of pulse interval of inserted pulses does not coincide with the period of a frequency divider. Therefore, the adjustment of interval of inserted pulses is essential.

On the other hand, as the present frequency multiplier provides equal interval pulses with no circuit adjustment, the use of the present frequency multiplier in a PLL frequency synthesizer can use the high reference frequency by n/m times, and therefore, phase noise is reduced with no spurious in an output signal. Further, high speed switching of frequency is possible in the present invention, since even when bandwidth of a loop filter 701 is enlarged, phase noise in a conventional PLL frequency synthesizer is kept.

(Effect of the Invention)

As described above in detail, the present programmable delay generator has a ramp wave generator, and a threshold voltage generator which has the same structure as that of the ramp wave generator. With that structure, no adjustment of a circuit component is necessary for providing desired delay time. Further, ramp wave voltage is determined independently from threshold voltage, a fractional delay time is obtained in which both numerator and denominator are designed. Further, the operation of a ramp wave generator and a threshold voltage generator is synchronized with an external clock signal, the accuracy of delay time is improved.

A frequency synthesizer according to the present invention uses the present programmable delay generator, which provides phase interpolation of an output pulse of an accumulator. Thus, a spurious free output signal is obtained with no circuit adjustment. Further, the present frequency synthesizer has the advantage that it consumes less power and operates at higher frequency as compared with a prior direct digital synthesizer which uses a ROM.

A frequency multiplier according to the present invention which uses the present programmable delay generator provides a pulse train having pulse interval shorter than that of an input signal, to provide spurious free output signal with no circuit adjustment. The use of the present programmable delay generator in a frequency multiplier has the advantage that the spurious characteristics do not deteriorate in spite of error of circuit constants and/or variation of power supply voltage. Further, the present frequency multiplier has no filter which a prior multiplier with a mixer has, and cascade connection of the present frequency multipliers is possible with no filter. This allows to enlarge frequency range to be multiplied, and decrease size of a circuit. Further, the present frequency multiplier has the advantage that the size of a circuit is small, and low power consumption, as compared with a prior frequency multiplier which has a PLL frequency synthesizer.

A duty ratio converter according to the present invention having the present programmable delay generator for determining pulse width of an output signal, provides precise duty ratio conversion with no circuit adjustment. The use of the present programmable delay generator in a delay generator has the advantage that no error in duty ratio in an output signal occurs in spite of error of circuit constants from designed value, and/or variation of power supply voltage. The use of the present programmable delay generator in a delay generator has the advantage that desired duty ratio is obtained with no circuit adjustment when input pulse frequency varies.

A PLL frequency synthesizer according to the present invention having the present frequency multiplier between a frequency divider and a phase comparator in a PLL frequency synthesizer, provides the same step frequency as that of a prior art, by using high reference frequency proportional to multiply ratio of a frequency multiplier. The use of high reference frequency allows high speed setting and high speed switching of frequency, while keeping similar low phase noise to that of a prior art. Further, when the similar frequency switching time to that of a prior art is kept, lower phase noise is obtained. The present PLL frequency synthesizer has the advantage of spurious free characteristics of the present frequency multiplier, and provides spurious free output signal with no jitter.

What is claimed is:

1. A programmable delay generator comprising:
   a first ramp wave generator and a second ramp wave generator, each having a capacitor of the same capacitance as each other for generating a ramp wave by flowing a current in said capacitor, each of them operating with external common clock pulses, and each of them providing a potential gradient and a final potential incorporated with an external set data; and
   a comparator for comparing an output ($V_s$) of the first ramp wave generator and an output ($V_k$) of the second ramp wave generator so that an output pulse is provided when the outputs of two ramp wave generators coincide with each other, wherein
      said first ramp wave generator providing a ramp voltage ($V_s$) upon receipt of a first set data (S) at a predetermined time ($t_0$),
      said second ramp wave generator providing a threshold voltage ($V_k$) upon receipt of a second set data (K) at a time which precedes said predetermined time ($t_0$) by at least one clock time (T),
      said comparator providing an output pulse delayed by delay time ($t_d$) which is proportional to ratio (K/S) of said second set data (K) and said first set data (S) from said predetermined time.

2. A programmable delay generator according to claim 1, wherein each of said first ramp wave generator and said second ramp wave generator comprises a current source which provides current proportional to set data S and set data K, respectively, a capacitor with one end coupled with a predetermined potential and being charged by said current source, and providing a ramp potential at the other end of the capacitor.

3. A programmable delay generator comprising:
   ramp wave voltage generator receiving a S-enable signal, a S-set data S and a clock signal for providing a ramp wave voltage $V_s$ across a first capacitor having a capacitance $C_1$ which receives a current $SI_0$ proportional to a value S synchronized with a first clock signal after said S-enable signal is provided, so that said ramp voltage is equal to $V_s=(SI_0/C)t$ where t is time after said first clock signal is provided;
   a threshold voltage generator receiving a K-enable signal which is enabled before said S-enable signal in advance at least by m number of clocks (m is an integer), a set data K, and a clock signal for providing a threshold voltage $V_K$ across a second capacitor having a capacitance $C_2$ which receives a current $KI_0$ proportional to value K during time mT, where T is a period of the clock signal for providing a threshold $V_K$ across the second capacitor, so that the threshold voltage $V_K$ is equal to $V_K=(KI_0/C)mt$;
   a delay time generation means which compares said ramp wave voltage $V_s$ with said threshold voltage $V_K$ so that an output signal having a predetermined pulse width provided when said $V_s$ coincides with said $V_K$ with delay time $t_d$ after said first clock where $t_d=(K/S)mT$ and
   where said first capacitor and said second capacitor are discharged by a predetermined S-leak signal and a predetermined K-leak signal after said output signal is provided.

4. A programmable delay generator according to claim 3, wherein said ramp voltage generator comprises a latch circuit which latches the set data S within a clock signal after said S-enable signal is provided, and a current switch array for flowing said current $SI_0$ in said first capacitor responsive to said set data S; and said threshold voltage generator comprises a latch circuit which latches the set data K with a clock signal after said K-enable signal is provided, and a current switch array for flowing said current $KI_0$ in said second capacitor responsive to said set data K for the duration mT.

5. A programmable delay generator comprising:
   a ramp wave generator receiving a S-enable signal, a S-set data S and a clock signal for providing a ramp wave voltage $V_{SC}$ across a first capacitor having capacitance $C_1$ which receives a current $I_0$ during a first clock signal $t_0$ after said S-enable signal is provided so that voltage $V_{SC}=(I_0/C_1)t$ is obtained across said first capacitor, where t is a time after a first clock signal $t_0$, and said voltage $V_{SC}$ is related to a ramp voltage $V_s$ such that $V_s=(S/M)(I_0/C)t$;
   a threshold voltage generator receiving a K-enable signal which is enabled before said S-enable signal in advance at least by m number of clocks (m is an integer), a threshold voltage $V_{kc}$ across a second capacitor having a second capacitance $C_2$ and which receives the current $I_0$ during time mT, where T is a period of a clock signal, so that a voltage $V_{kc}=(I_0/C_2)mT$ is obtained across said second capacitor and said voltage $V_{kc}$ is maintained across said second capacitor, and the voltage $V_{kc}$ is related to a threshold voltage $V_k$ such that $V_k=(K/M)(I_0/C_2)mT$;
   a delay time generation means which compares said ramp wave voltage $V_s$ with said threshold voltage $V_k$ so that an output signal having a predetermined pulse width is provided when said $V_s$ coincides with said $V_k$ with a delay time $t_d$ after said first clock signal $t_0$ such that $t_d=(K/S)mT$;
   wherein said first capacitor and said second capacitor are discharged by a predetermined S-leak signal and a predetermined K-leak signal after said output signal is provided.

6. A programmable delay generator according to claim 5, wherein said ramp wave voltage generator comprises two latch circuits for latching an external set data S and a S-enable signal triggered by a clock signal, a current switch for flowing current in said first capacitor following said S-enable signal, and a voltage divider for dividing voltage across said first capacitor with a divide ratio S/M in accordance with said set data S; and said threshold voltage generator comprises a pair of two latch circuits for latching an external set data K and K-enable signal triggered by a clock signal, a current switch for flowing current in said second capacitor following said K-enable signal, and a voltage divider for dividing voltage across said second capacitor with divide ratio S/M in accordance with said set data K.

7. A frequency synthesizer comprising:
an accumulator receiving a clock signal and a set data S for accumulating said set data S synchronized with said clock signal;
a data converter for calculating a set data K with ($2^{n-1} - \theta_p$), where $\theta_p$ is a previous output data $\theta$ of said accumulator by 1 clock period before the most significant bit $\theta_{MSB}$ rises;
a control circuit which receives an output $\theta$ of said accumulator and provides a K-enable signal which rises before $\theta_{MSB}$ by one clock period, and has a pulse width equal to one clock period; and
a programmable delay generator which receives said set data S, set data K provided by said data converter, said K-enable signal provided by said control circuit, and an S-enable signal which is the most significant bit $\theta_{MSB}$ of an output data $\theta$ of said accumulator;
wherein said programmable delay generator comprises
a first ramp wave generator and a second ramp wave generator, each having a capacitor of the same capacitance as each other for generating a ramp wave by flowing a current in said capacitor, each of them operating with external common clock pulses, and each of them providing a potential gradient and a final potential incorporated with an external set data,
a comparator for comparing an output ($V_S$) of the first ramp wave generator and an output ($V_K$) of the second ramp wave generator so that an output pulse is provided when the outputs of the two ramp wave generators coincide with each other,
said first ramp wave generator providing a first ramp voltage ($V_S$) upon receipt of a first set data (S) at a predetermined time ($t_0$),
said second ramp wave generator providing a threshold voltage ($V_K$) upon receipt of a second set data (K) at a time which precedes said predetermined time by at least one clock time (T), and
said comparator providing an output pulse delayed by delay time ($t_d$) which is proportional to ratio of said second set data and said first set data from said predetermined time.

8. A frequency synthesizer according to claim 7, wherein an S-leak signal and a K-leak signal for discharging said first capacitor and said second capacitor, respectively, are obtained by feedback of an output signal of said programmable delay generator.

9. A frequency synthesizer comprising:
an accumulator receiving a clock signal and a set data S for accumulating said set data S synchronized with said clock signal;
a data converter which receives an output data $\theta$ and an overflow signal of said accumulator and calculates a set data K with ($2^n - \theta$);
a control circuit which receives an output $\theta$ of said accumulator and provides a K-enable signal which rises one clock time before said overflow signal rises, and has a pulse width equal to one clock period; and
a programmable delay generator which receives said set data S, said set data K provided by said data converter, said K-enable signal provided by said control circuit, and an S-enable signal which is the overflow signal of an output data $\theta$ of said accumulator;
wherein said programmable delay generator comprises
a first ramp wave generator and a second ramp wave generator, each having a capacitor of the same capacitance as each other for generating a ramp wave by flowing a current in said capacitor, each of them operating with external common clock pulses, and each of them providing a potential gradient and a final potential incorporated with an external set data,
a comparator for comparing an output ($V_S$) of the first ramp wave generator and an output ($V_K$) of the second ramp wave generator so that an output pulse is provided when the outputs of the two ramp wave generators coincide with each other,
said first ramp wave generator providing a first ramp voltage ($V_S$) upon receipt of a first set data (S) at a predetermined time ($t_0$),
said second ramp wave generator providing a threshold voltage ($V_K$) upon receipt of a second set data (K) at a time which precedes said predetermined time by at least one clock time (T), and
said comparator providing an output pulse delayed by delay time ($t_d$) which is proportional to ratio of said second set data and said first set data from said predetermined time.

10. A frequency synthesizer according to claim 9, wherein an S-leak signal and a K-leak signal for discharging said first capacitor and said second capacitor, respectively, are obtained by feedback of an output signal of said programmable delay generator.

11. A frequency synthesizer comprising:
an accumulator receiving a clock signal and a set data S for accumulating said set data S synchronized with said clock signal;
a data converter which receives an output data $\theta$ and an OFD signal which is one clock delayed signal of an overflow signal of said accumulator and calculates a set data K with (S−$\theta$);
a control circuit which receives an output $\theta$ and said OFD signal of said accumulator and provides a K-enable signal which rises one clock time before said overflow signal rises, and has a pulse width equal to one clock period; and
a programmable delay generator which receives said set data S, said set data K provided by said data converter, said K-enable signal provided by said control circuit, and an S-enable signal which is the OFD signal of an output data $\theta$ of said accumulator;
wherein said programmable delay generator comprises
a first ramp wave generator and a second ramp wave generator, each having a capacitor of the same capacitance as each other for generating a ramp wave by flowing a current in said capacitor, each of them operating with external common clock pulses, and each of them providing a potential gradient and a final potential incorporated with an external set data,
a comparator for comparing an output ($V_S$) of the first ramp wave generator and an output ($V_K$) of the second ramp wave generator so that an output pulse is provided when the outputs of the two ramp wave generators coincide with each other,
said first ramp wave generator providing a first ramp voltage ($V_S$) upon receipt of a first set data (S) at a predetermined time ($t_0$),
said second ramp wave generator providing a threshold voltage ($V_K$) upon receipt of a second set data (K) at a time which precedes said predetermined time by at least one clock time (T), and said comparator providing an output pulse delayed by delay time ($t_d$) which is proportional to ratio of said second set data and said first set data from said predetermined time.

12. A frequency synthesizer according to claim 11, wherein an S-leak signal and a K-leak signal for discharging said first capacitor and said second capacitor, respectively are obtained by feedback of an output signal of said programmable delay generator.

13. A frequency multiplier receiving an input signal having period T and providing an output signal with N/M times of frequency as high as that of said input signal comprising:

plurality of delay generators each providing a respective delay time d+(kM/N)T, where d is an arbitrary time, N is an integer larger than 2, M is an integer larger than 1, k is an integer from 0 to N−1;

a distributor receiving an input signal and providing each of said delay generators a delay timing and an OR gate for providing a logical sum of outputs of said delay generators;

wherein each of said delay generators comprises a first ramp wave generator and a second ramp wave generator, each having a capacitor of the same capacitance as each other for generating a ramp wave by flowing a current in said capacitor, each of them operating with external common clock pulses, and each of them providing a potential gradient and a final potential incorporated with an external set data, a comparator for comparing an output ($V_S$) of the first ramp wave generator and an output ($V_K$) of the second ramp wave generator so that an output pulse is provided when the outputs of the two ramp wave generators coincide with each other, said first ramp wave generator providing a first ramp voltage ($V_S$) upon receipt of a first set data (S) at a predetermined time ($t_0$), said second ramp wave generator providing a threshold voltage ($V_K$) upon receipt of a second set data (K) at a time which precedes said predetermined time by at least one clock time (T), and said comparator providing an output pulse delayed by delay time ($t_d$) which is proportional to ratio of said second set data and said first set data from said predetermined time.

14. A frequency multiplier according to claim 13, wherein delay time of said delay generators is one of (1/4)T and (3/4)T, and said frequency multiplier is a frequency doubler.

15. A frequency multiplier according to claim 13, wherein delay time of said delay generators is one of (1/6)T, (3/6)T and (5/6)T, and said frequency multiplier provides an output frequency three times as high as that of an input frequency.

16. A frequency multiplier according to claim 13, wherein delay time of said delay generators is one of (1/6)T, (5/6)T, and (9/6)T, and said frequency multiplier provides an output frequency (3/2) times as high as that of an input frequency.

17. A frequency multiplier as claimed in one of claims 13 or 14, further comprising:

a duty ratio converter including a toggle flip-flop (T-FF) receiving an output of said frequency multiplier and switching an output signal high and low with each input pulse from said frequency multiplier.

18. A frequency multiplier according to one of claims 13–16, in which a ramp wave generator is used commonly in a plurality of delay generators.

19. A duty ratio converter comprising:

a distributor receiving an input pulse having a period T, and providing a plurality of outputs having a rise time and a fall time of said input pulse;

a plurality of flip-flops switching an output pulse of a same high and low synchronized with an output of said distributor;

a plurality of delay generators receiving an output of said distributor as a clock signal, and providing said flip-flops an output to control the same high and low;

wherein each of said delay generators comprises a first ramp wave generator and a second ramp wave generator, each having a capacitor of the same capacitance as each other for generating a ramp wave by flowing a current in said capacitor, each of them operating with external common clock pulses, and each of them providing a potential gradient and a final potential incorporated with an external set data, a comparator for comparing an output ($V_S$) of the first ramp wave generator and an output ($V_K$) of the second ramp wave generator so that an output pulse is provided when the outputs of the two ramp wave generators coincide with each other, said first ramp wave generator providing a first ramp voltage ($V_S$) upon receipt of a first set data (S) at a predetermined time ($t_0$), said second ramp wave generator providing a threshold voltage ($V_K$) upon receipt of a second set data (K) at a time which precedes said predetermined time by at least one clock time (T), and said comparator providing an output pulse delayed by delay time ($t_d$) which is proportional to ratio of said second set data and said first set data from said predetermined time.

20. A duty ratio converter comprising:

distributor receiving an input pulse having a period T and providing a rise time and a fall time of said input pulse to a plurality of branches;

a plurality of delay generators operating with a clock signal provided by said distributor;

a plurality of flip-flops receiving an output of said delay generator, to provide an output signal switching high and low; and an OR gate to provide a logical sum of said flip-flops wherein each of said delay generators comprises a first ramp wave generator and a second ramp wave generator, each having a capacitor of the same capacitance as each other for generating a ramp wave by flowing a current in said capacitor, each of them operating with external common clock pulses, and each of them providing a potential gradient and a final potential incorporated with an external set data, a comparator for comparing an output ($V_S$) of the first ramp wave generator and an output ($V_K$) of the second ramp wave generator so that an output pulse is provided when the outputs of the two ramp wave generators coincide with each other, said first ramp wave generator providing a first ramp voltage ($V_S$) upon receipt of a first set data (S) at a predetermined time ($t_0$), said second ramp wave generator providing a threshold voltage ($V_K$) upon receipt of a second set data (K) at a time which precedes said predetermined time by at least one clock time (T), and said comparator providing an output pulse delayed by delay time ($t_d$) which is proportional to ratio of said second set data and said first set data from said predetermined time.

21. A duty ratio converter as in one of claims 19 or 20, in which a ramp wave generator is used commonly in a plurality of delay generators.

22. A frequency multiplier according to any one of claims 14–17, further comprising:
   a PLL frequency synthesizer comprising
     a voltage controlled oscillator (VCO),
     a frequency divider to divide output frequency of said voltage controlled oscillator to 1/N,
     a phase comparator for comparing phase of said frequency divider and phase of an external reference signal,
     a loop filter for integrating output of said phase comparator and providing an integrated output to said voltage controlled oscillator.

* * * * *